United States Patent
Gu et al.

(10) Patent No.: US 6,672,171 B2
(45) Date of Patent: Jan. 6, 2004

(54) COMBINATION DIFFERENTIAL AND ABSOLUTE PRESSURE TRANSDUCER FOR LOAD LOCK CONTROL

(75) Inventors: Youfan Gu, Superior, CO (US); Garry Holcomb, Boulder, CO (US); Ole Wenzel, Gentofte (DK)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 09/907,541

(22) Filed: Jul. 16, 2001

(65) Prior Publication Data

US 2003/0010129 A1 Jan. 16, 2003

(51) Int. Cl.⁷ .................................................. G01L 9/12
(52) U.S. Cl. ...................................................... 73/724
(58) Field of Search .......................... 73/715, 716, 717, 73/718, 719, 720, 721, 722, 723, 724, 725, 726, 727; 137/14, 87, 571; 361/283.1, 283.2, 283.3, 283.4

(56) References Cited

U.S. PATENT DOCUMENTS

| | | | |
|---|---|---|---|
| 4,850,806 A | * | 7/1989 | Morgan et al. ............. 417/53 |
| 4,902,138 A | | 2/1990 | Goeldner et al. |
| 4,943,457 A | | 7/1990 | Davis et al. |
| 5,277,215 A | * | 1/1994 | Yanagawa et al. ........... 137/14 |
| 5,347,869 A | | 9/1994 | Shie et al. |
| 5,363,872 A | | 11/1994 | Lorimer |
| 5,557,972 A | | 9/1996 | Jacobs et al. |
| 5,902,932 A | | 5/1999 | Bills et al. |

FOREIGN PATENT DOCUMENTS

| | | |
|---|---|---|
| WO | WO 98/48168 | 10/1998 |
| WO | WO 01/71781 A2 | 9/2001 |

OTHER PUBLICATIONS

Stephen P. Hansen, Kathryn Whitenack, Pressure measurement and control in loadlocks, Solic State Technology, Oct. 1997, 151–152, 154, 156, 158.

* cited by examiner

Primary Examiner—William Oen
(74) Attorney, Agent, or Firm—James R. Young; Faegre & Benson LLP

(57) ABSTRACT

Transducer apparatus and method combining both an absolute pressure sensor for sensing absolute pressure in the load lock chamber and a differential pressure sensor for sensing a pressure difference between ambient atmospheric pressure and pressure in a load lock chamber and provides control signals for opening an interior door from the load lock chamber into a vacuum processing chamber and for opening an exterior door between ambient atmosphere and the load lock chamber. The transducer can also produce signals to control transition from slow to fast vacuum pump-down of load lock chamber pressure at a predetermined pressure set point.

29 Claims, 20 Drawing Sheets

COMBINATION DIFFERENTIAL AND ABSOLUTE PRESSURE TRANSDUCER FOR LOAD LOCK CONTROL

BACKGROUND OF THE INVENTION

1. Field of the Invention

The present invention is related generally to load lock controls for vacuum processing chambers and more particularly to a combination differential and absolute pressure transducer for load lock control and a method of controlling load locks with such combination differential and absolute pressure transducer.

2. State of the Prior Art

Vacuum processing in reaction chambers is commonly used to deposit thin films of semiconductor materials, metal, dielectrics, and the like onto substrates in the fabrication of semiconductor devices. Typical processes that utilize such vacuum reaction chambers include chemical vapor deposition (CVD) and physical vapor deposition (PVD) and many variations of such processes, as well as etching processes to clean substrates or remove selected portions of materials. Typically, the vacuum process chamber is evacuated with a vacuum pump to a very low pressure, for example down $10^{-4}$ torr, and, in some processes, much lower, such as $10^{-6}$ or even $10^{-7}$ torr. When the desired vacuum is attained, feed gases are flowed into the process chamber at desired rates and proportions to react and/or deposit desired materials onto substrate wafers. When deposition of the desired materials is complete, the wafer is removed from the process chamber and another substrate wafer is inserted into the process chamber, where the deposition process is repeated.

Significant vacuum pumping time is required to pump the process chamber down to the desired pressure, and undesirable contaminants enter the process chamber every time it is opened to atmosphere. Therefore, substantial efforts are made to avoid opening the process chamber to atmosphere and to maintain the process chamber pressure as close to the desired low deposition pressure as possible. Load locks are used, therefore, to facilitate insertion of substrates into the process chambers for deposition and/or etch processing and to remove the wafers from the process chamber while maintaining the vacuum in the process chamber.

A load lock is, essentially, a second vacuum chamber, often smaller in size than the process chamber, and connected to the process chamber by a passage with an interior "door" or large valve that can be opened for insertion and removal of the wafers into and out of the process chamber. When the interior door is closed, it seals the passage so that no air or gas can flow into or out of the process chamber through the passage. The load lock also has an exterior "door" or large valve, which opens the load lock chamber to the atmosphere to allow insertion or removal of wafers into and out of the load lock chamber. When the exterior door is closed, it seals the load lock so that no air or other gas can flow into or out of the load lock chamber.

In operation, the process chamber has its pressure maintained at the desired vacuum by a process chamber vacuum pump. With the interior door of the load lock closed, the exterior door is opened to the atmosphere, so one or more wafer substrate(s) can be inserted into the load lock chamber. With the wafer(s) in the load lock chamber, the exterior door is closed, and a load lock vacuum pump draws the air out of the load lock chamber, until the pressure in the load lock chamber is about as low as the pressure in the process chamber. Then, the interior door is opened, so the wafer substrate(s) can be moved from the load lock chamber, through the passage, and into the process chamber. When the wafer(s) are in the process chamber, the interior door can be closed while the wafer(s) are processed in the process chamber, i.e., while feed gas is fed into the process chamber and materials are either deposited on, or etched from, the wafer(s). Alternatively, but not preferably, the interior door could be left open during processing.

When the processing is complete, the wafer(s) are removed from the process chamber into the load lock chamber. The interior door is then closed to maintain the vacuum in the process chamber, while the pressure in the load lock is brought up to atmospheric pressure by allowing air or an inert gas, such as nitrogen, to flow into the load lock chamber. When the pressure in the load lock chamber is at or near atmospheric pressure, the exterior door is opened to allow removal of the processed wafer(s).

Some more complex process systems have a central transfer chamber with several process chambers branching out from the transfer chamber. In those circumstances, the load lock is usually connected by the passage and interior door to the transfer chamber.

In the past, it has been difficult to control the load lock in an efficient manner. Convection pirani pressure sensors, which have absolute pressure measuring capabilities from about 1,000 torr down to about $10^{-3}$ torr (atmospheric pressure at sea level is about 760 torr) have been used in pressure transducers adapted to control opening of the doors in load locks. Such control of load lock doors with that type of pressure transducer has been beneficial, but problems persist. For example, the $10^{-3}$ torr lower pressure measuring limit of the convection pirani sensors is not low enough for effective control of opening the interior door, because the process chambers are usually operated at pressures at least one to three orders of magnitude below that limit, i.e., at $10^{-4}$ torr or even $10^{-6}$ torr or lower. Thus, even when the load lock pressure is pumped down to $10^{-3}$ torr, opening the interior door causes an undesirable rush of gas molecules, along with any particulate impurities and water vapor they carry along, into the process chamber. It puts a greater load on the vacuum pumps of the process and/or load lock chambers, causing larger pump down times after each opening and closing of the interior door, especially in the process chamber to get the pressure pumped back down to the desired process pressure. Such added pumping overhead adds to the processing time and decreases efficiency.

The problems are even worse on the upper pressure end, i.e., at or near atmospheric pressure (about 760 torr), because density of gas or air molecules is much greater at that pressure than at the vacuum pressures used in vacuum process chambers. Thus, opening the exterior door when pressure inside the load lock chamber is not the same as the ambient atmospheric pressure causes much stronger air currents and is much more contaminating, even when the load lock is in a clean room. Again, convection pirani sensors do have the pressure sensing capabilities in the atmospheric range, but it is impossible to set them to control exterior door opening effectively due to constantly changing ambient atmospheric pressure conditions due to weather, altitude, and the like. For example, some manufacturers set the transducer to generate a signal to open the exterior door of the load lock when pressure of the load lock chamber is brought up to 750 torr, thinking it will work for most locations that are slightly above sea level. However, ambient atmospheric pressure in Boulder, Colorado, for example, is about 630 torr, so having a transducer that opens the exterior door when pressure in the load lock chamber reaches 750 torr in Boulder, Colo., would still have adverse gas current and contamination effects. Further, ambient atmospheric pressure at any geographic location varies, such as with different weather conditions or fronts that move into and out of any particular location. Resetting such transducers to generate control signals at different pressures is not easy, may require changing software or control circuits, and is not something that is done by ordinary users.

A combination differential and absolute pressure transducer, which is the subject matter of co-pending U.S. patent application, Ser. No. 60/191,223, eliminated many of the problems described above by utilizing a differential pressure sensor for controlling operation of the exterior door and an absolute pressure sensor for controlling operation of the interior door. In that combination system, the transducer produces a signal to open the interior door to the processing chamber when the absolute pressure sensor senses that the load lock has been evacuated down to a predetermined pressure that is intended to match the evacuated pressure level of the processing chamber. On the other hand, the transducer produces a signal to open the exterior door of the load lock when the differential pressure sensor senses that the load lock chamber pressure equals the ambient atmospheric pressure.

While such combination differential and absolute pressure transducer was a significant improvement over previous load lock control systems, it still had problems. For example, modern load lock pressures reach $10^{-4}$ torr or less, and the traditional Pirani absolute pressure sensor used in the preferred embodiment of that system is not able to provide accurate and repeatable readings in such low pressures, e.g., below about $10^{-3}$ torr. Such traditional convection Pirani sensors also have a flat zone in a range of about 10 to 100 torr, in which accuracy is low. While a flat zone in that pressure range does not affect door control operations by the transducer, which occur at other pressures as described above, it does interfere with other pressure monitoring and control functions, such as switching from slower load lock chamber pump-down rate in high-pressure regions to faster pump-down rate n low-pressure regions. Such switching usually is set to occur at some desired set point in a range between about 0.1 torr and about 10 torr, because fast pump down at higher pressures causes turbulence that can stir up particles and contaminant wafers. Conventional Pirani sensors also do not respond as fast to pressure changes as desired for controlling such switching from slow or "roughing" to fast or "turbo" rates. Also, accurate readings of pressure is always important for a variety of reasons. For example, if the pressure gauge is reading high, it takes longer to reach the set point, thereby reducing through-put of products. If it reads low, it can lead to potential contamination problems.

There have also been some problems with differential pressure sensing responsiveness and accuracy due to very rapid back-filling rates used to bring the load lock pressure back up to ambient atmospheric pressure, where the exterior door is opened.

Finally, the previous combination differential and absolute pressure transducer described in co-pending U.S. patent application, Ser. No. 60/191,223, is bulky, difficult to mount, connect, and use, and is somewhat inefficient and not as reliable as desired.

SUMMARY OF THE INVENTION

Accordingly, an object of this invention is a more accurate, more reliable, more robust, better packaged, and easier to use combination differential and absolute pressure transducer for load lock control.

Additional objects, advantages, and novel features of the invention shall be set forth in part in the description that follows, and in part will become apparent to those skilled in the art upon examination of the following or may be learned by the practice of the invention. The objects and the advantages may be realized and attained by means of the instrumentalities and in combinations particularly pointed out in the appended claims.

To achieve the foregoing and other objects, the apparatus of the present invention may comprise, but is not limited to, a combination differential and absolute pressure transducer apparatus for controlling a load lock that facilitates transfer of parts between a room at ambient atmospheric pressure and a vacuum processing chamber maintained at a pressure less than one (1) torr and that has an evacuatable load lock chamber, an exterior door positioned between the load lock chamber and the room, an interior door positioned between the load lock chamber and the processing chamber, an exterior door actuator that is responsive to an exterior door control signal to open or close the exterior door, an interior door actuator that is responsive to an interior door control signal to open or close the interior door, and a vacuum pump connected to the load lock chamber for evacuating the load lock chamber. A slowing pump control device, such as a two-stage valve, can be installed between the vacuum pump and the load lock chamber. The combination differential and absolute pressure transducer has a differential pressure sensor that is capable of sensing a pressure difference between ambient atmospheric pressure in the room and pressure in the load lock chamber, and it has an absolute pressure sensor that is capable of sensing absolute pressure in the load lock chamber. The differential pressure sensor is mounted so that a first side of the differential pressure sensor is exposed to ambient atmospheric pressure in the room and so that a second side of the differential pressure is exposed to pressure in the load lock chamber. The absolute pressure sensor is also mounted so that it is exposed to pressure in the load lock chamber. Both the differential pressure sensor and the absolute pressure sensor can be connected in fluid flow relation to the load lock chamber by a common manifold. A differential pressure transducer circuit is connected to the differential pressure sensor and is capable of generating an exterior door control signal at a preset differential pressure value, and an absolute pressure transducer circuit is connected to the absolute pressure sensor and is capable of generating an interior door control signal at a preset absolute pressure value. An exterior door control link connected between the differential pressure transducer circuit and the exterior door is capable of delivering exterior door control signals generated by the differential pressure transducer circuit to the exterior door actuator; an interior door control link connected between the absolute pressure transducer and the interior door is capable of delivering interior door control signals generated by the absolute pressure transducer circuit to the interior door actuator. These links can be any of a variety of devices for transmitting signals, such as a wire or wires, infrared transmitter and receiver, and the like, and can include appropriate input/output components, amplifiers, and other devices as would be understood by persons skilled in the art, once they understand the principles of this invention.

The absolute pressure sensor preferably comprises a micropirani sensor with a resistivity that varies as a function of the pressure (heat exchange between a hot filament and a cooler environment) in the load lock chamber, and the absolute pressure transducer circuit can include a micropirani bridge circuit that incorporates the micropirani sensor resistive elements in the bridge circuit, which provides a signal voltage that varies as pressure in the load lock varies. A secondary temperature compensation circuit uses a resistive element on the micropirani sensor, preferably fabricated on the same substrate, but that is not exposed to load lock pressure to correct for variations in the bridge output signal that occur due to temperature changes as opposed to absolute pressure changes in the load lock. Placing this resistive element on the same substrate improves temperature compensation accuracy and response time. An analog process circuit connected to the micropirani bridge circuit conditions, amplifies, and adjusts the signal voltage from the bridge circuit for use in controlling the opening of the interior door between the load lock and the process chamber, and it includes zero and full scale adjustment features. It also produces an auxiliary output signal that is amplified even more for use especially in low pressure ranges where the regular output signal may be too weak to use accurately and dependably. A relay control circuit uses the conditioned, amplified, and adjusted voltage to generate an interior door control signal when such voltage is at a value that corresponds with a set point absolute pressure value, which can be adjusted. Hysteresis is also provided to prevent dithering and chattering of the relay at or near set point pressure.

The differential pressure sensor preferably comprises a thin film diaphragm piezo semiconductor pressure sensor in which a thin film diaphragm is positioned with the load lock chamber pressure on one side of the diaphragm and ambient atmospheric pressure of the room on another side of the diaphragm so that the diaphragm flexes one way or the other, with the direction and magnitude of such flexing dependent on the direction and magnitude of the differential pressure across the diaphragm. Resistivity of piezo semiconductor elements (preferably polysilicon resistors) varies as a function of differential pressure across a diaphragm. An analog process circuit conditions, amplifies, and adjusts the signal voltage from the bridge circuit to a more usable signal. A relay control circuit monitors the voltage from the analog process circuit and generates the exterior door control signal when the voltage of the analog process circuit corresponds with the present differential pressure value. Set point differential pressure for actuating the relay and hysteresis for preventing dithering and chattering the relay at or near set point differential pressure is also provided.

The miniaturized pressure transducer of this invention also has a very compact structure in which a manifold mounting base connects both absolute and differential pressure sensors mounted on a circuit board with the interior pressure of the load lock. Because load locks are very complex, space is usually very limited around the load lock chamber, and this miniaturized configuration is much easier to mount and less obstructive to other components and functions of the load lock.

To further achieve the foregoing and other objects, the invention may also comprise, but is not limited to, a method of automatically controlling such a load lock, including predetermining both a desired differential pressure value at which to open the external door and a desired absolute pressure value at which to open the internal door. The method then includes sensing actual differential pressure between the load lock chamber and the ambient pressure in the room, comparing the actual differential pressure to the predetermined differential pressure value, and, when the actual differential pressure equals the predetermined differential pressure value, producing and delivering an exterior door control signal to the exterior door actuator. The method also includes sensing actual absolute pressure in the load lock chamber, comparing the actual absolute pressure to the predetermined absolute pressure value, and, when the actual absolute pressure equals the predetermined absolute pressure value, producing and delivering an interior door control signal to the interior door actuator.

The method of this invention may also comprise, but is not limited to, transducing the sensed differential pressure to a voltage that is indicative of, or corresponds in value to, the sensed differential pressure, producing a differential pressure reference voltage that corresponds in value to the voltage that is transduced from the differential pressure when the differential pressure is at a desired differential pressure value for opening the exterior door, comparing the differential pressure reference voltage to such transduced voltage, and, when the transduced voltage equals the differential pressure reference voltage, producing and delivering the exterior door control signal to the exterior door actuator. This method may further include transducing the sensed absolute pressure to a voltage that is indicative of, or corresponds in value to, the absolute pressure, producing an absolute pressure reference voltage that corresponds in value to the voltage that is transduced from the absolute pressure when the absolute pressure is at a desired absolute pressure for opening the interior door, comparing the absolute pressure reference voltage to such transduced voltage, and, when the transduced voltage equals the absolute pressure reference voltage, producing and delivering the exterior door control signal to the interior door actuator. Providing hysteresis in both the absolute pressure signal and the differential pressure signal prevents dither and chattering of relays at or near set point absolute and differential pressures.

The method also includes mounting absolute and differential pressure sensors on a circuit board and mounting the circuit board on a manifold base in a manner that connects the absolute and differential pressure sensors to pressure in the interior of the load lock.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention. In the Drawings.

DETAILED DESCRIPTION OF THE PREFERRED EMBODIMENTS

Figure 1:
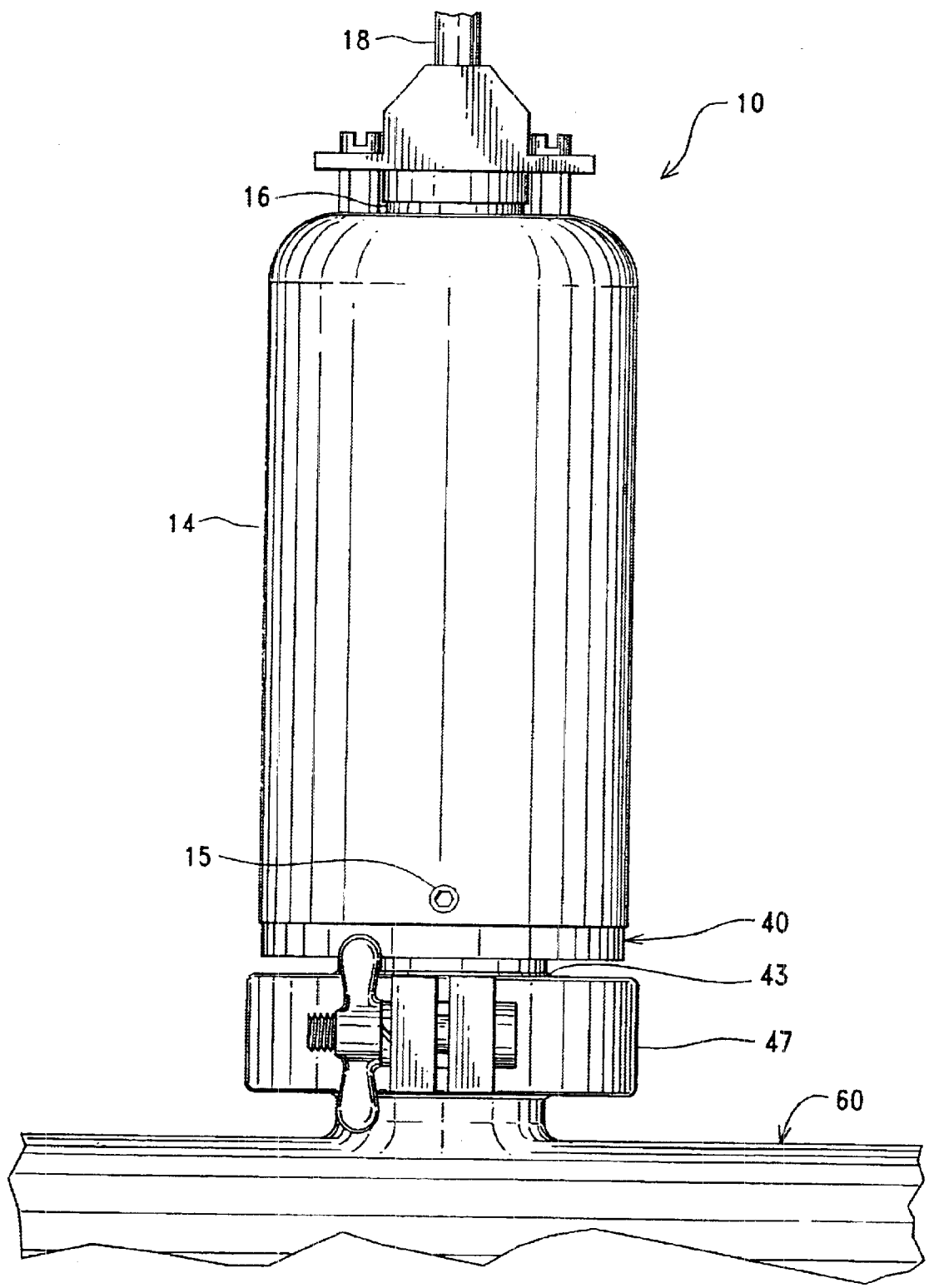
FIG. 1 is an elevation view of the miniaturized pressure transducer of this invention shown mounted on a load lock chamber.
Figure 2:
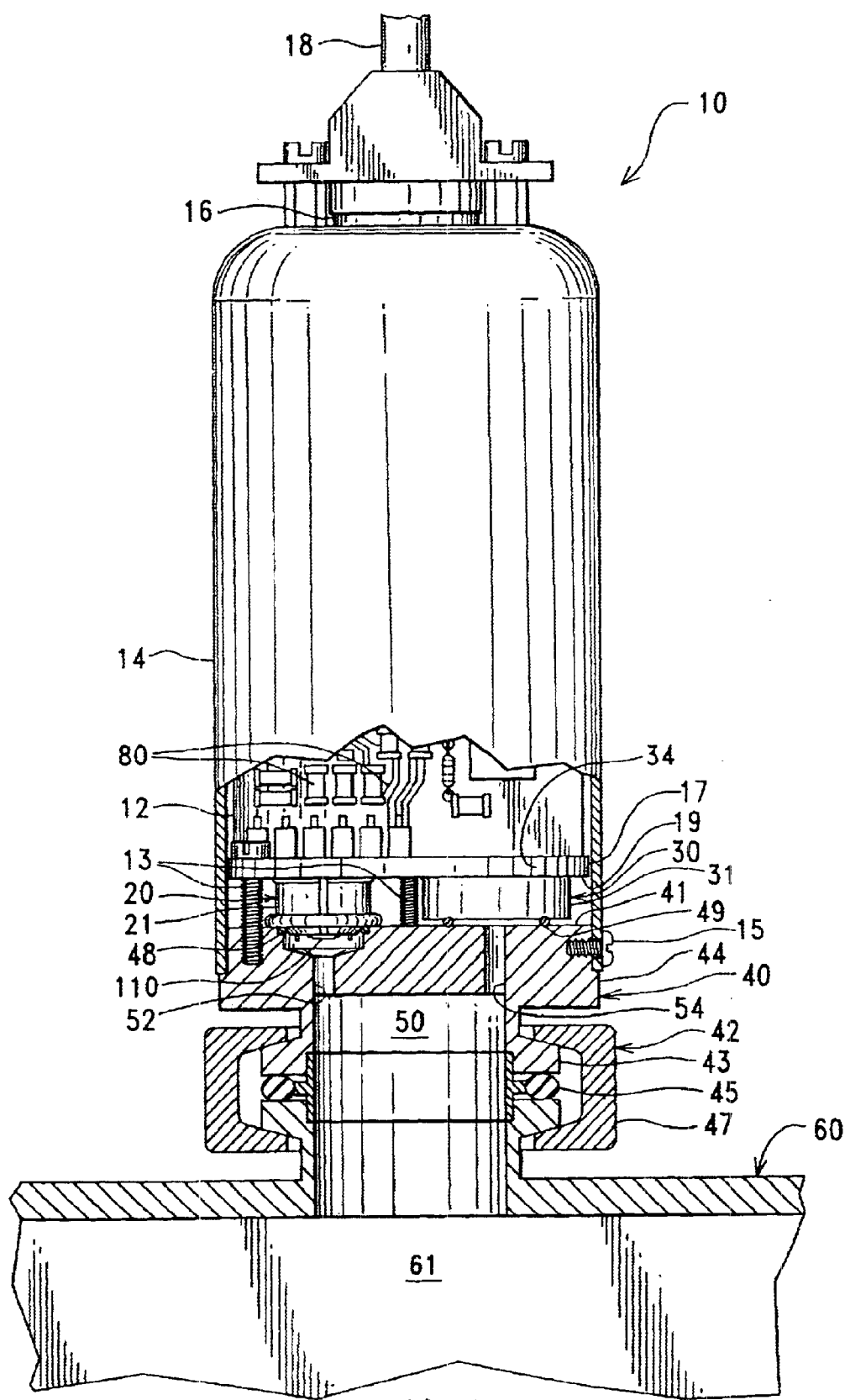
FIG. 2 is an elevation view of the miniaturized pressure transducer similar to FIG. 1, but with portions of the dust cover, manifold, load lock chamber, and mounting structure cut away or sectioned to illustrate the sensor and transducer mounting structures of this invention.

A miniaturized pressure transducer assembly 10 according to this invention is shown in FIGS. 1 and 2 mounted on a load lock chamber 60. In general, the miniaturized pressure transducer assembly 10 comprises an absolute pressure sensor assembly 20 and a differential pressure sensor assembly 30, as best seen in FIG. 2, each of which is connected in gas flow relationship to a common manifold 40. The manifold 40 has a connector 42, such as a conventional flanged pipe fitting 43, for connecting the manifold 40 to the load lock chamber 60, which will be discussed below. The connection is shown sealed with an O-ring seal 45 and secured with a clamp 47 in a conventional manner. A circuit board 12 with signal processing and control circuitry 80, which will be discussed in more detail below, is shown in FIG. 2 with the absolute pressure sensor assembly 20 and the differential pressure sensor assembly 30 mounted on its bottom end. The circuit board 12 is mounted and fastened by a plurality of screws 13 to the manifold 40, with the screws 13 tightened to seal the pressure sensors 20, 30 to the top surface 41 of the manifold with O-ring seals 48, 49, respectively. A dust cover 14 surrounding and covering the circuit board 12 with the absolute pressure sensor assembly 20 and the differential pressure sensor assembly 30 is fastened by a screw 15 to the manifold 40. A 9-pin K1 connector 16 extends from the circuit board 12 through the housing 14 to accommodate connecting the circuit board 12 to an outside power source, to control actuators (not shown) for the load lock doors (discussed below), and the like via a power/data cord 18.

Figure 3:
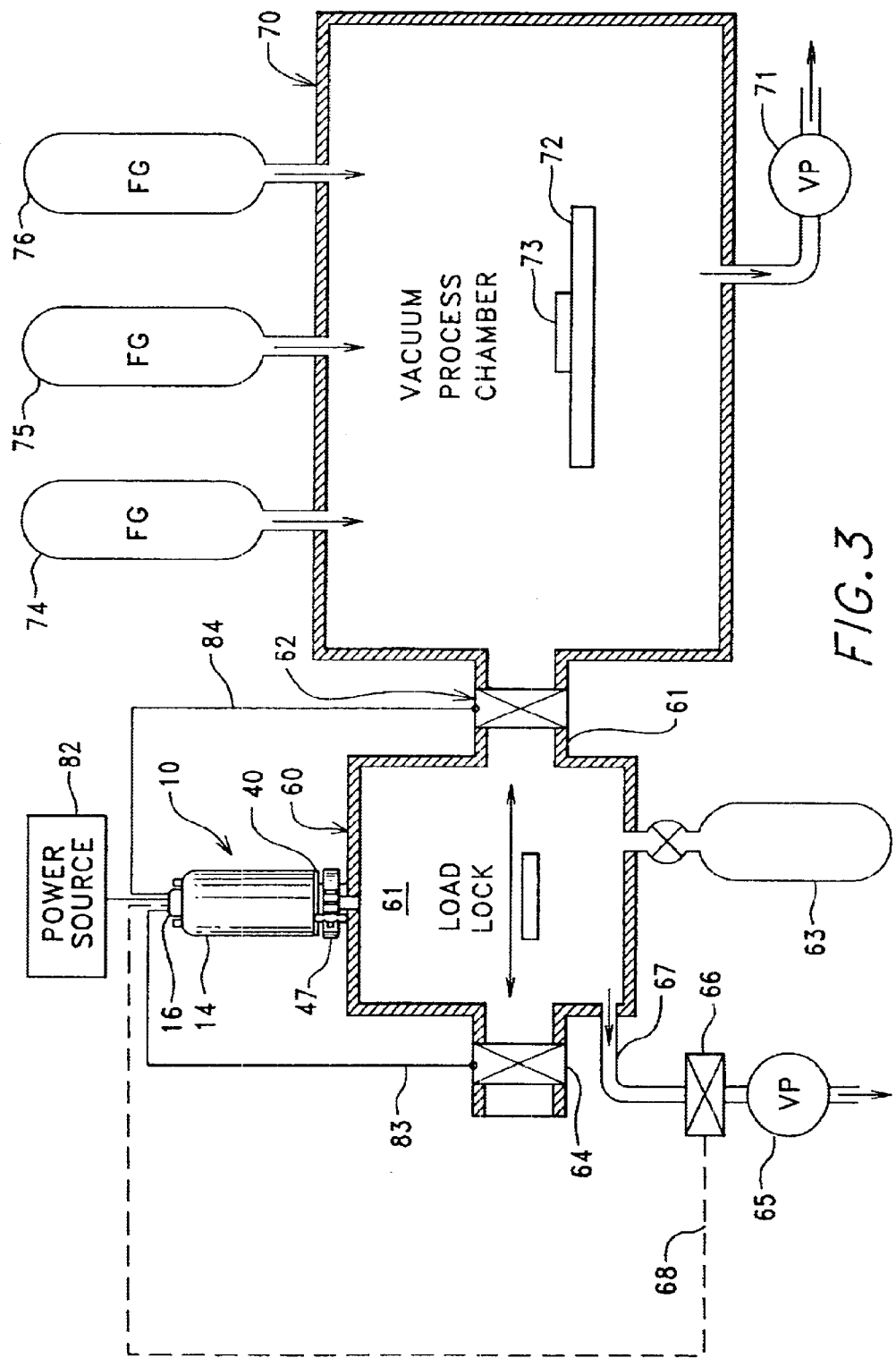
FIG. 3 is a diagrammatic view of a process chamber equipped with a load lock chamber and illustrating the use of the miniaturized pressure transducer of this invention with the load lock chamber.

Referring now to FIG. 3 in combination with FIGS. 1 and 2, the load lock 60 is shown diagrammatically connected to a vacuum processing chamber 70 by a passage 61 with an interior door 62. The processing chamber 70 has a vacuum pump 71 to maintain a vacuum in the processing chamber 70, usually in the range of about 1 to $10^{-8}$ torr. A platform 72 is usually provided to support one or more wafers 73 during processing, such as deposition of semiconductor thin films derived from feed gas sources 74, 75, 76. The load lock 60 also has a vacuum pump 65 to pump down pressure in the load lock chamber 60. A source of gas 63, such as nitrogen, or sometimes air, is used to bring the pressure in the load lock chamber 60 back up to ambient, so the exterior door 64 can be opened to remove and/or insert a wafer 73 from and/or into the load lock chamber 60.

The miniaturized pressure transducer assembly 10 is shown in FIGS. 1, 2, and 3 connected in fluid-flow relation to the load lock chamber 60, so that the manifold 40, thus also the absolute pressure sensor assembly 20 and the differential pressure sensor assembly 30, are effectively at the same pressure as the interior 61 of the load lock chamber 60. An outside electric power source 82 is shown schematically in FIG. 3 connected to the circuit board 12 via the connector 16. Process control links 83 between the circuit board 12 and the exterior door 64, and the power/data cord 18, carries control signals from the electric circuit 80 to a suitable actuator (not shown) or actuator circuit (not shown), such as a solenoid or motor actuator (not shown) to control opening and/or closing the exterior door 64. Such actuators or actuator circuits for opening and/or closing exterior doors 64 on load lock chambers and how a control signal or signals can be used to operate such actuators or actuator circuits are well-known to persons skilled in the art and need not be described here for an understanding or enablement of this invention. A process control link 84 between the circuit board 12 and the interior door 62, via the connector 16 and power/data cord 18, carries control signals from the electric circuit 80 to a suitable actuator (not shown) or actuator circuit (not shown), such as a solenoid or motor actuator (not shown) to control opening and/or closing the interior door 62. Again, such actuators or actuator circuits for opening and/or closing an interior door 62 of a load lock chamber and how a control signal or signals can be used to operate such actuators or actuator circuits are well-known to persons skilled in the art and need not be described here for understanding or enablement of this invention.

Another optional process control link 68, shown in broken lines in FIG. 3, can be used to control the effective pumping speed of the vacuum pump 65 by controlling a throttle valve 66, which can be any of a variety of adjustable occlusion devices, including a two-stage valve. By partially closing the throttle valve 66 and thereby slowing down the effective pumping speed, turbulence is reduced in the pumping line 67 and in the load lock chamber 60, thus reducing particle contamination inside the load lock chamber 60 from particles and contaminants that could otherwise be stirred up in the pumping line 67 and load lock chamber 60. When the load lock chamber 60 is evacuated and most of the air or gases are removed, turbulence is not likely to form because of the lower gas density. Therefore, when the vacuum in the load lock chamber 60 gets pumped down to a certain threshold pressure, the process control link 68 can be used to let the throttle valve 66 open fully, thereby stepping the effective pumping speed of the vacuum pump 65 up to full speed.

The process control links 68, 83, and 84 can be any type of components or devices that are known in the art for transmitting signals from one component to another. For example, they can include simple wire conductors, wireless links, such as infra-red or radio transmitters and receivers, or other techniques and, any associated input/output components, amplifiers, and the like, as would be understood by persons skilled in the art.

As illustrated in the function block diagram in FIG. 4, the absolute pressure sensor assembly 20, preferably a thin film micropirani sensor as will be described in more detail below, which can sense absolute pressure accurately in a range of about 1000 torr down to about $10^{-5}$ torr or lower, senses pressure in the load lock chamber 60. A micropirani bridge circuit 90 produces a voltage signal that is indicative of the absolute pressure in the load lock chamber 60 sensed by the micropirani sensor assembly 20. A secondary temperature compensation circuit 92 adds a voltage offset to the signal to compensate for signal voltage variations due to temperature changes, which compensation contributes to the pressure sensing accuracy and extended low pressure range of the absolute pressure sensing capabilities of the system, as will be described in more detail below. An analog process circuit 93 drives the bridge circuit 90 and conditions, amplifies, and allows adjustments and calibrations to the voltage signal from the bridge circuit 90. The relay control circuit 94 utilizes the voltage signal from the analog process circuit 93 to generate control signals that can be used to operate a relay 95 ("vacuum switch") to send control signals via data line 84 to the interior door 62 actuator to open the interior door 62 when the pressure in the load lock chamber 60 reaches a certain minimum pressure to match or at least get close to the pressure at which the process chamber 70 (FIG. 3) is operated. Alternatively, the control signal from relay control circuit 94 can be used to prevent the interior door 62 from being opened until the minimum threshold pressure in the load lock chamber 60 is reached. Also, as mentioned above, the relay control circuit 94 can also be configured to drive the vacuum relay switch 95 to output a control signal to the throttle valve 66 controller or actuator or two-stage valve to switch the vacuum pump 65 from a slow ("roughing") pump mode to a faster ("turbo") mode when the pressure in the load lock chamber gets pumped down to some selected intermediate pressure threshold, which is usually in a range of about 0.1 torr to about 10 torr, so as to keep gas flow, thus turbulence, in the load lock chamber 60 to a minimum during pump down of the load lock chamber 60 when pressure is relatively high and then speed up the pump-down process when much of the gas has been removed. When the vacuum relay switch 95 is used to operate the slow/turbo pump-mode actuator 66, as described above, the interior door 62 actuator can be equipped with its own controller (not shown) to utilize an absolute pressure output signal 96 from the analog process circuit 93 to open the interior door 62 at any desired absolute pressure level. This absolute pressure output signal 96, which has a voltage that is always indicative of the absolute pressure in the load lock 60 at any instant in time, can also be connected to an absolute pressure monitor 98, as indicated by broken line 84' in FIG. 4, to monitor and/or record absolute pressure in the load lock 60 for all or any part of load lock 60 operation cycle. An auxiliary absolute pressure output signal 97, which also has a voltage that is indicative of absolute pressure in the load lock 60, but which is a multiple higher in magnitude (e.g., 10 times greater) than the voltage of output signal 96, is also provided by the analog process circuit 93. This higher voltage output signal 97 is a very useful alternative signal for operating the interior door actuator 62, as indicated by the broken line connection 84" in FIG. 4, when the process chamber 70 (FIG. 3) and load lock 60 are operated at pressures so low (e.g., less than $10^{-4}$ torr) that voltage on the primary output signal 96 would be too low to detect and use effectively. This higher voltage absolute pressure output signal 97 can also be used to monitor the absolute pressure by a suitable monitor and/or recorder 98.

The differential pressure sensor assembly 30, senses differential pressure between the ambient atmospheric pressure and the pressure in the load lock chamber 60, as will be explained in more detail below. In the preferred embodiment, the differential pressure sensor assembly 30 is a thin film membrane with piezo resistors built into the membrane structure to vary electrical resistance, thus voltage, as pressure difference between the atmospheric pressure and the load lock chamber 60 pressure causes the membrane to flex, as will be explained in more detail below. A piezo bridge circuit 100 senses overall electrical resistance and changes in resistance of the piezo differential pressure sensor assembly 30 due to differential pressure changes, and it converts the overall resistance into a voltage signal that is indicative of the pressure differential at any instant in time. An analog process circuit 102 conditions, amplifies, and provides calibration and adjustment functions for the voltage signal from the piezo bridge circuit. The relay control circuit 104 utilizes the conditioned, amplified, and adjusted voltage signal from the analog process circuit 102 to output a control signal to a relay 105 ("atmospheric switch") to generate a control signal on data line 83 to the exterior door 64 actuator to either open the exterior door 64 when a certain pressure differential is reached or to prevent the exterior door 64 from opening until a certain pressure differential is reached. For example, the exterior door 64 could be opened when the differential pressure between the atmosphere and the load lock chamber 60 is zero, i.e., when the load lock chamber 60 pressure and the atmospheric pressure are equal. At such zero differential pressure, there would be very little, if any, flow of air or gas (other than diffusion) either into or out of the load lock chamber 60 when the exterior door 64 is opened. Of course, the relay control circuit 104 could be set to output a control signal at a differential pressure other than zero, if desired. For example, if the relay control circuit 104 is set to not open the exterior door 64 until the pressure in the load lock 60 is slightly higher than atmospheric pressure, it will ensure that there is an initial outflow of gas from the load lock chamber 60 to the atmosphere when the exterior door is opened, thereby further minimizing any inflow of contaminants from the atmosphere into the load lock 60.

For purposes of this description, references to top, bottom, up, down, and the like refer to the orientation of FIG. 1 and are used for convenience and not for limitation. The miniaturized pressure transducer and its component parts can be used in any orientation.

Figure 5:
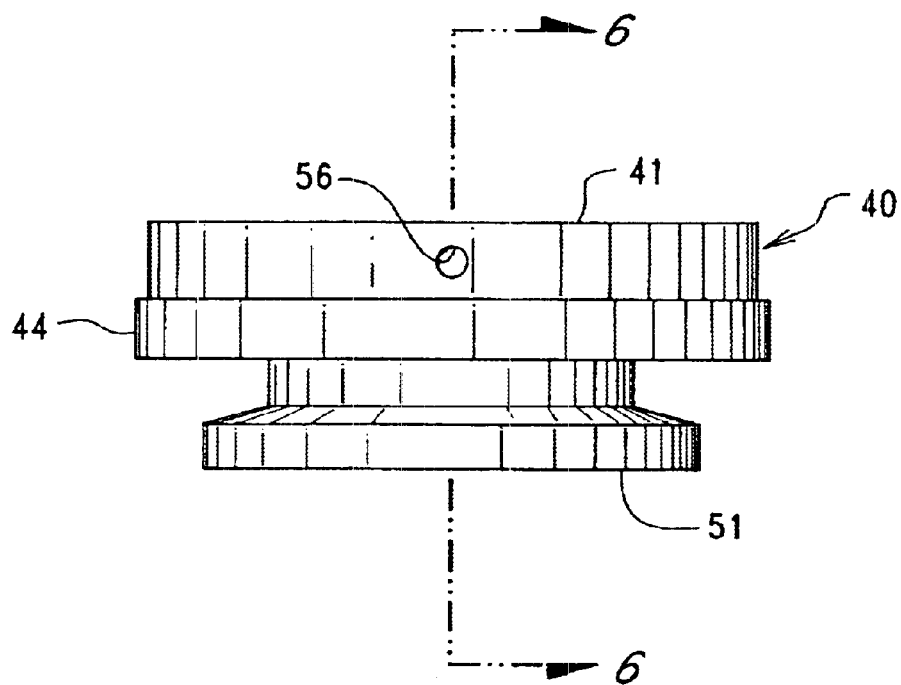
FIG. 5 is an elevation view of the combination manifold and mounting base for the miniaturized pressure transducer of this invention.

Referring now to FIGS. 2, 5. and 6, the manifold 40 serves as a mounting base for the circuit board 12, and the pressure sensor assemblies 20, 30 are mounted on a panel 17 at the bottom of the circuit board 12 between the bottom of the circuit board 12 and the top surface 41 of the manifold 40. The manifold 40 has a body 44 with a top surface 41, bottom surface 51, and a cavity 50 that is open at the bottom surface 51 and extends upwardly toward, but not all the way to, the top surface 41. Two ducts 52, 54 extend from the cavity 50 to the top surface 41 in spatial alignment with the pressure sensor assemblies 20, 30, respectively. Therefore, when the manifold 40 is mounted on the load lock 60, as shown in FIG. 2, the manifold 40 connects the pressure sensor assemblies 20, 30 into fluid flow relationship with the interior 61 of the load lock 60.

As mentioned above, the fastening screws 13 are tightened to snug the pressure sensors 20, 30 against the top surface 41 with O-rings 48, 49, respectively sealing the pressure sensor assemblies 20, 30 to the top surface 41 around the ducts 52, 54, respectively. The absolute pressure sensor assembly 20 has a cylindrical housing 21 that is fastened to the bottom surface 19 of panel 17 and contains a micropirani absolute pressure sensor 110, which is exposed to the pressure in the interior 61 of the load lock 60 through an open bottom of the housing 21 (see FIG. 7) via the duct 52 and cavity 50 in manifold 40. The absolute pressure sensor housing 21 is closed at its top, because the micropirani pressure sensor 110 is exposed only to the pressure in the interior 61 of the load lock 60 and not to atmospheric pressure. The micropirani sensor 100 will be described in more detail below.

Figure 7:
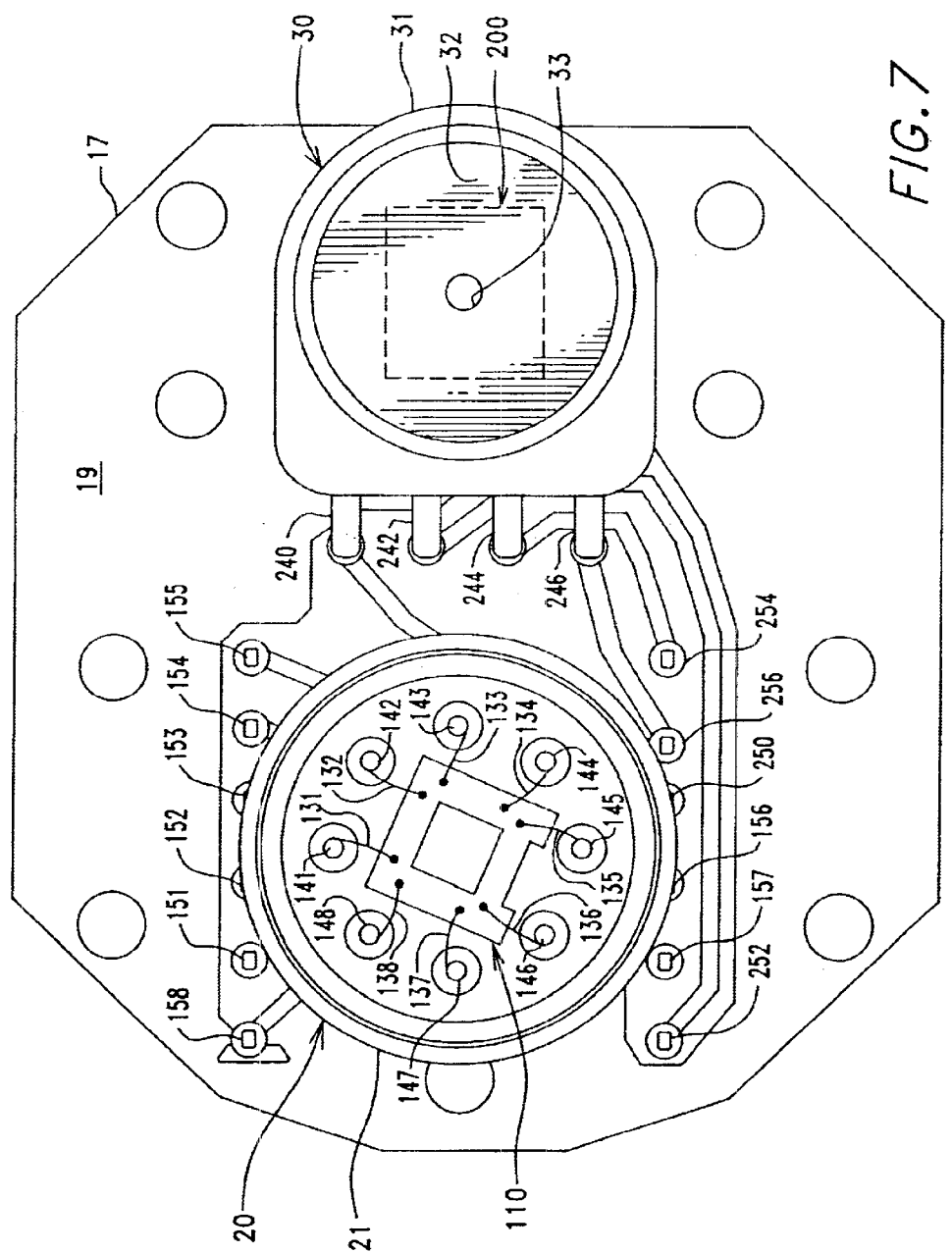
FIG. 7 is a bottom plan view of the absolute and differential pressure sensors mounted on the bottom panel of the circuit board structure to illustrate along with FIG. 2 the interface of the sensors with the combination manifold and mounting base structure of FIGS. 5 and 6.

The differential pressure sensor assembly 30 also has a cylindrical housing 31 that contains piezo differential pressure sensor 200, which is not shown in FIG. 2 but is indicated by broken lines in FIG. 7, because it is concealed by the bottom surface 32 of the housing 31. The piezo differential pressure sensor 200 will be described in more detail below. The housing 31 is mostly closed at its bottom surface 32 as best seen in FIG. 7, but there is a hole 33 through the bottom surface 32, which exposes the bottom side of the piezo differential pressure sensor 200 to the pressure of the interior 61 of the load lock 60 via the duct 54 and cavity 50 of manifold 40, as best seen in FIG. 2. The top side of the piezo differential pressure sensor 200 has to be exposed to ambient (atmospheric) pressure in order to sense the difference between the atmospheric pressure and the pressure of the interior 61 of the load lock 60, i.e., the differential pressure, as will be explained in more detail below. Therefore, the housing 31 does have an opening in its top (not shown) and is exposed to the atmosphere. A hole 34 through the bottom panel 17 of circuit board 12, as shown in broken lines in FIG. 2, can be aligned with an opening (not shown) in the top of housing 31 to facilitate exposure of the top of the piezo differential pressure sensor 200 (not shown in FIG. 2) to the atmosphere.

Figure 6:
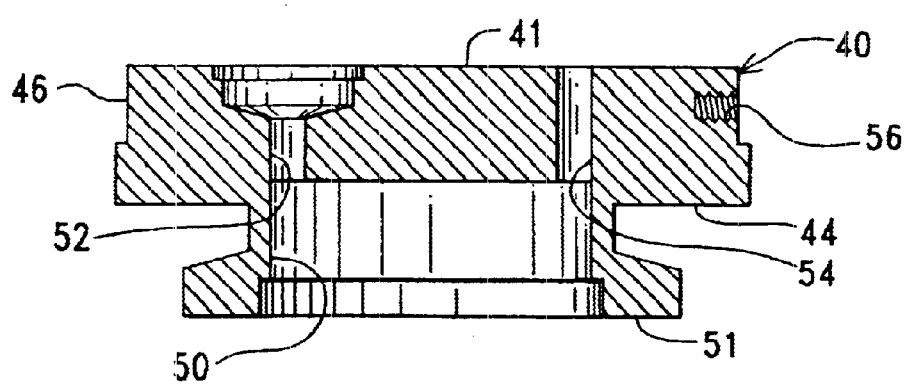
FIG. 6 is a cross-section of the combination manifold and mounting base taken along section line 5—5 of FIG. 4.

The dust cover 14 is sized to fit around a recess 46 in the side of the manifold 40 adjacent the top surface 41 and can be fastened in place with a screw 15 (FIG. 2) screwed into a threaded hole 56 (FIGS. 5 and 6) in manifold 40. While providing the cavity 50 is preferred, the manifold would work for purposes of this invention without the cavity 50 and extending the ducts 52, 54 to the bottom surface 51 of manifold 40.

Figure 8:
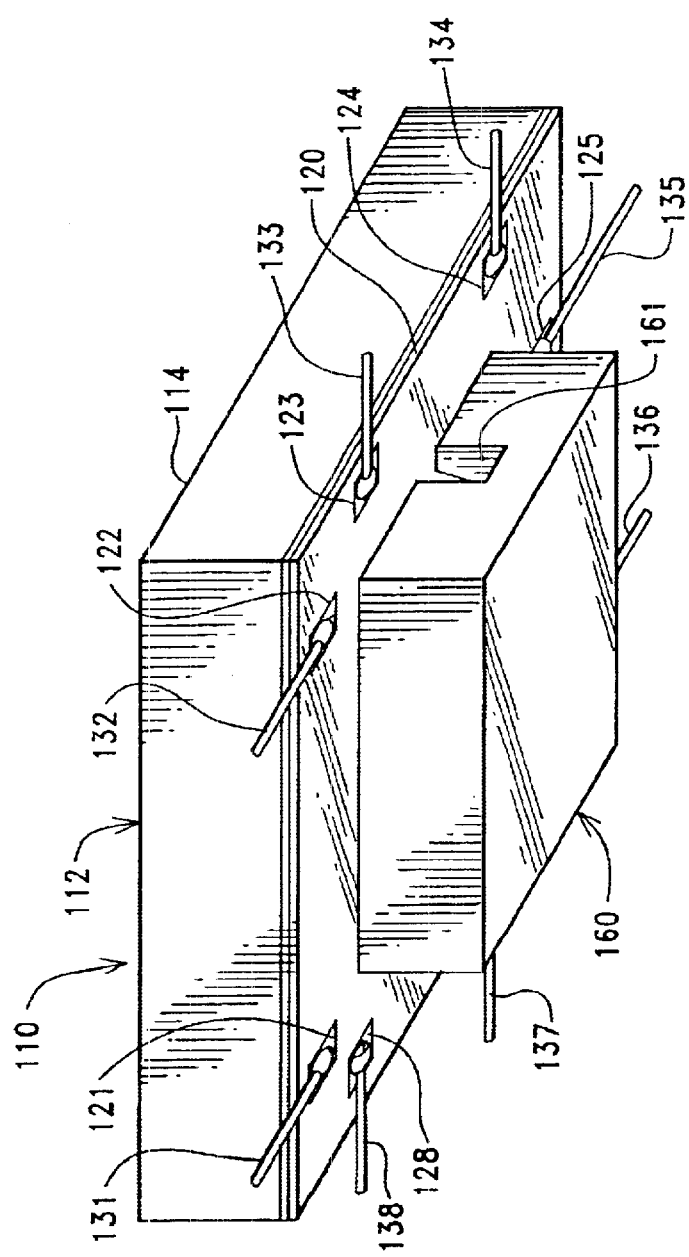
FIG. 8 is an isometric view of the bottom of the micropirani absolute pressure sensor utilized in the preferred embodiment miniaturized pressure transducer of this invention.

An enlarged view of a preferred embodiment of the micropirani absolute pressure sensor 110 is shown in FIG. 8. The main body 112 comprises a substrate 114 preferably fabricated with silicon (Si), and thin film components and resistive elements (not seen in FIG. 8), which, when operative as explained in more detail below, provide a signal that is indicative of absolute pressure to which it is exposed. Materials other than silicon will work for the substrate, but silicon is inexpensive, and deposition of other materials on silicon is a well-known field, thus conducive to keeping costs down. The resistive elements (not seen in FIG. 8) terminate in metal contact pads 121, 122, 123, 124, 125, 126, 127, 128, preferably gold, which are exposed through the passivation (protective) layer 120, and respective leads 131, 132, 133, 134, 135, 136, 137, 138 are soldered to the contact pads 121–128 to connect the micropirani absolute pressure sensor 110 electronically to the circuit board panel 17, as best seen in FIG. 7. The leads 131–138 connect to pins 141, 142, 143, 144, 145, 146, 147, 148, respectively, in the sensor assembly 20, as also best seen in FIG. 7. The pins 141–148 connect by traces to circuit board pins 151, 152, 153, 154, 155, 156, 157, 158, respectively in the circuit board panel 17, and the circuit board pins 151–158 lead to the various electronic components of the circuit 80, as will be described in more detail below. Referring again to FIG. 8, a cover 160 is mounted on the main body 112 to protect fragile thin film components (not seen in FIG. 8), which will be described below. An opening 161 into a cavity 162 (not seen in FIG. 8) in the cover 160 exposes the thin film components (not seen in FIG. 8) in the body 112 to the pressure of the interior 61 of the load lock 60, as described above and shown in FIG. 2.

While the micropirani absolute pressure sensor 110 is shown in FIG. 8 oriented as it is mounted in the absolute pressure assembly 20 in FIG. 2, the body 114 and cover 160 are shown inverted in FIGS. 9 and 10 for better clarity as the structures of those components are described below. Therefore, for purposes of the description of FIGS. 9 and 10, terms such as over and under refer to the orientation of FIGS. 9 and 10 and not FIG. 8, although, again, these orientational terms are for descriptive convenience, and not for limitation of the scope of the invention.

Figure 9:
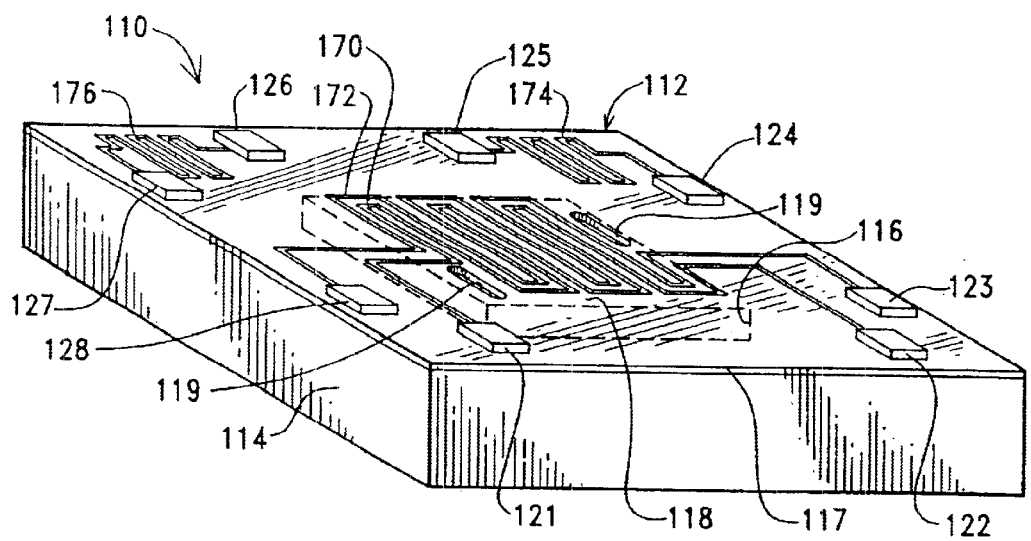
FIG. 9 is an isometric view of a partially constructed micropirani pressure sensor inverted from its mounted orientation of FIG. 8 to illustrate how the micropirani sensor is structured and operates.

Referring now to FIG. 9, the main body 112 of the micropirani absolute pressure sensor 110 is shown partially constructed with a cavity 116 (shown in broken lines) etched into the substrate 114 and with a dielectric non-conductive film 117 of silicon nitride ($Si_3N_4$) or silicon dioxide ($SiO_2$) overlaying the substrate 114 to form a thin membrane 118 over the cavity 116. The membrane 118 has one or more holes 119 extending through the membrane 118 into the cavity 116 to provide free flow of gas molecules and equalization of pressure over and under the membrane 118. Two resistive elements or filaments 170, 172, preferably nickel (Ni), are deposited on the film dielectric 117, including on the membrane 118. The resistive elements 170, 172 terminate at respective metal (preferably gold (Au)) contact pads 121, 122 and 123, 128. Two additional resistive elements 174, 176 are deposited on the dielectric film 117, but not on the membrane 118 portion of film 117, which are used for temperature compensation adjustments, as will be described in more detail below. The resistive elements 174, 176, preferably nickel (Ni), terminate at respective contact pads (preferably gold (Au)) 124, 125 and 126, 127.

Figure 10:
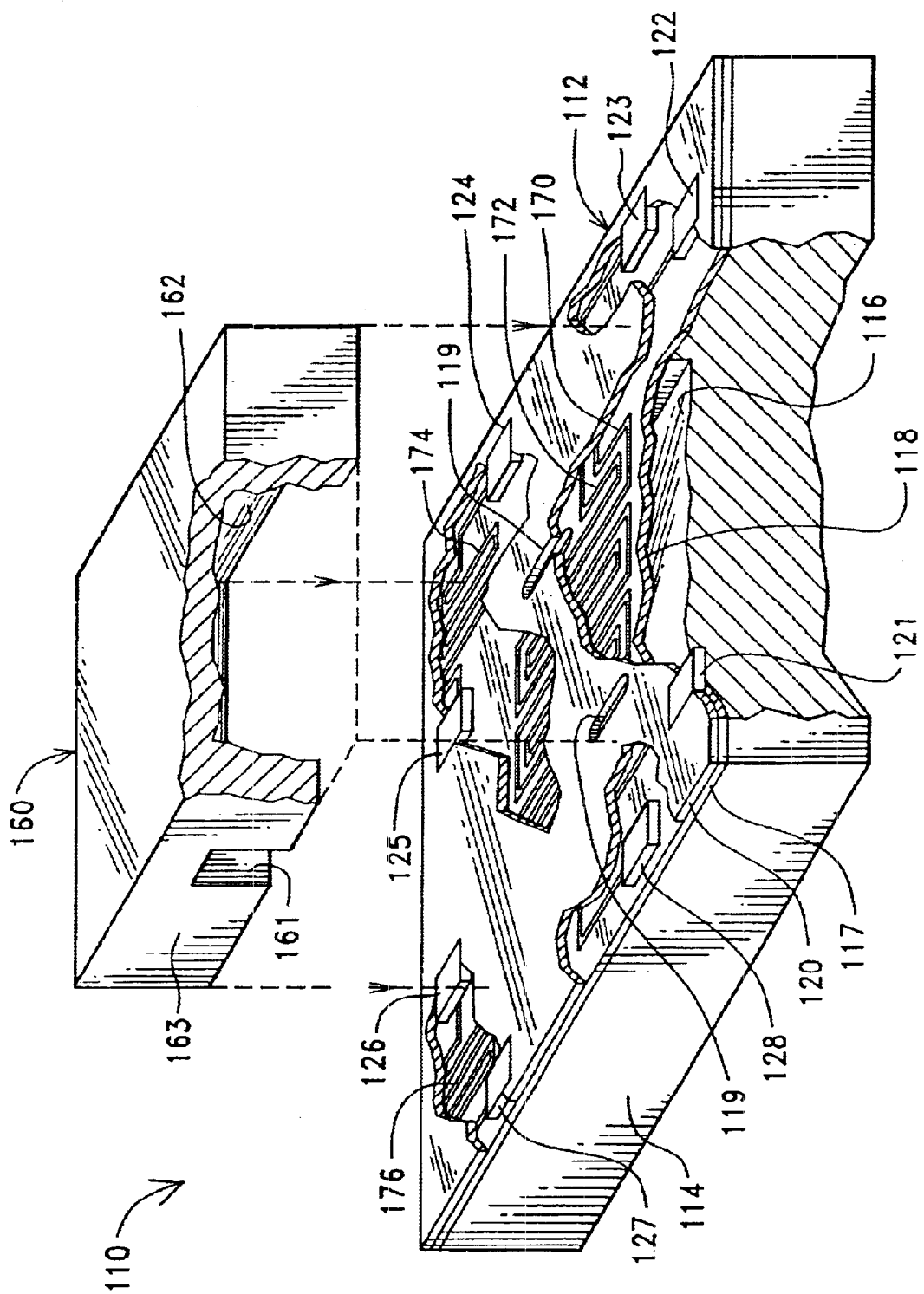
FIG. 10 is an isometric view of the mocropirani pressure sensor similar to FIG. 9, but more completed with the top thin film layer in place, and further with portions of sensor structure and cover component cut away in order to reveal further structural details.

As best seen in FIG. 10, another passivation (protective) layer 120 of a dielectric material, such as $Si_3N_4$ or $SiO_2$, is deposited over the first dielectric film 117 and over the resistive elements 170, 172, 174, 176. The portions of the dielectric layers 117, 120 and substrate 114 that are cut away reveal features of the structure for clarity of description only. As mentioned earlier, the contact pads 121–128 are left exposed so that leads 131–138 (FIG. 8) can be soldered to them. As revealed by the cut-away portion in FIG. 10, the cover 160 has a cavity 162 sized about the same as the cavity 116 in the substrate 114 and the hole 161 extending through a sidewall 163 of the cover into the cavity 162. The cover, which can also be made of silicon (Si) is positioned on the main body 112 with the cavities 116, 162 juxtaposed in relation to each other on opposite sides of the membrane 118.

In this application, the two resistive elements 170, 172 can be connected together, preferably in series, but possibly in parallel, to function as a single resistive element. Such connection can be done in the electric circuit 80. In operation, a voltage is applied across the resistive elements 170, 172 to flow an electric current through the resistive elements 170, 172, which is monitored with a bridge circuit 90 (FIGS. 4 and 16), as will be described in more detail below. The electric current flowing through the resistive elements 170, 172 creates heat that has to be dissipated. Some of the heat from the resistive elements dissipates by radiation, but some also is conducted away by gas molecules in the cavities 116, 162. The higher the pressure in the cavities 116, 162, the more molecules there will be to conduct heat away from the resistive elements 170, 172. Conversely, the less pressure in cavities 116, 162, the fewer gas molecules to conduct away heat. The miniature cavities 116, 162 and the thin film membrane 118 in which the resistive elements are embedded between the cavities has several advantages for this application. For example, the thin film membrane 118 leaves very little material between the resistive elements 170, 172 and gas molecules in the cavities 116, 162, so heat transfer from the resistive elements 170, 172 to the gas molecules in cavities 116, 162 is not impeded. At the same time, the thin film membrane 118 does not conduct heat laterally to the bulky silicon body 112 of the sensor very rapidly, so heat dissipation from the resistive elements 170, 172 is driven more by the gas molecules in the cavities 116, 162, which is pressure dependent, than by lateral heat conduction through the membrane 118 to the body 112, which is not pressure dependent. Therefore, heat conduction away from the resistive elements or filaments 170, 172 is very responsive to changes in pressure in the cavities 116, 162.

A thermal boundary layer forms around a hot filament, the thickness of which is about ten to fifty times the mean free path of the gas molecules (statistical distance gas molecules travel between collisions). Higher pressures have higher gas densities, thus more gas molecules, which provides shorter mean free path. If the distance d between the hot filament surface to the colder surroundings is made larger than the thermal boundary layer thickness, the change of room temperature or sensor temperature will have less effect on the sensor output, which is the reason for the undesirable flat zone in conventional pirani and convection gauges. However, because the cavities 116, 162 in the micropirani sensor 110 are small (about 20 $\mu$m deep), i.e., less than the thermal boundary layer to avoid the undesirable flat zones mentioned above, it has much better sensitivity at high-pressure regions. Also, the small cavities 116, 162 with only small openings 161 and 119 change pressure simultaneously with pressure changes outside the cavities 116, 162 while virtually preventing convection currents of gas molecules in the cavities 116, 162, which would otherwise affect heat conduction, thus the accuracy and repeatability of the output signals as a function of pressure changes. Also, the small cavities 116, 162 provide a small gap between the heat source (resistive elements 170, 172) and the heat sink (main body 112 and cover 160), e.g., about 20 $\mu$m as mentioned above, which improves heat transfer by gas conduction, thus sensor sensitivity to pressure changes at the higher end, e.g., about 1 to 1000 torr range.

Figure 11:
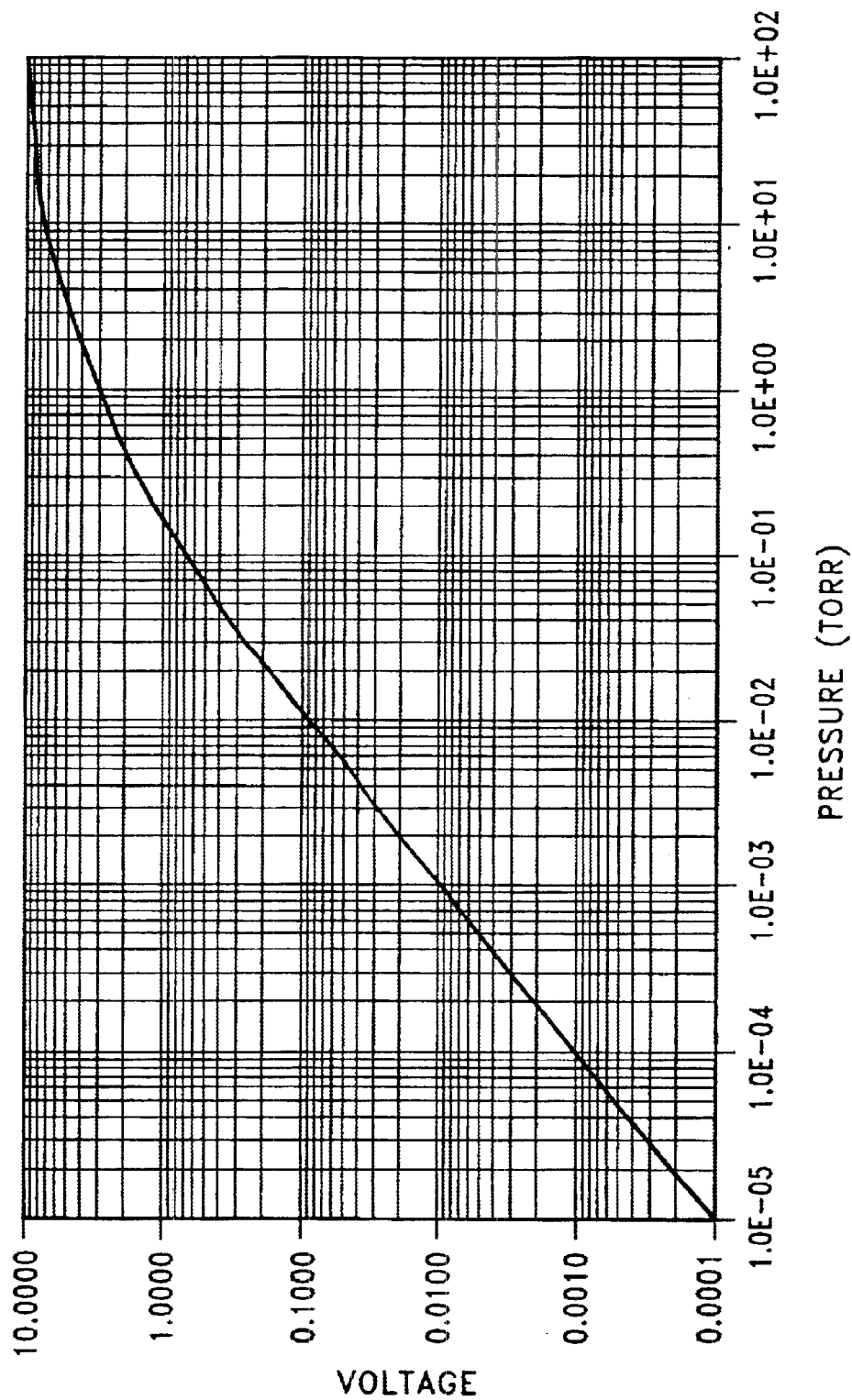
FIG. 11 is a chart showing the relationship between absolute pressure and the voltage signal produced by the micropirani sensor and electric circuit.

As heat is conducted away from the resistive elements or filaments 170, 172, they cool, and cooler filaments 170, 172, have less resistance to current flow than hotter filaments 170, 172. Therefore, changes in pressure in the interior 61 of load lock 60, thus changes in pressure in cavities 116, 162 of the micropirani absolute pressure sensor 110, cause changes in the bridge circuit 90 that are indicative of such pressure changes, as will be discussed in more detail below. Suffice it to say at this point that such changes in the bridge circuit 90 are detectable and used by the circuit 80 to produce control signals for load lock 60 doors 62, 64 and other load lock 60 components. The graph in FIG. 11 shows an example raw signal voltage from a micropirani pressure sensor 110 for a range of absolute pressures. In this example, the signal voltage outputs range from 0.0001 volt to 10.0000 volts for absolute pressures ranging from 1.0E−05 to 1.0E+02 torr, i.e., from $10^{-5}$ torr to 100 torr. While it is clear from this graph that the output voltage flattens out in the higher pressure regions, accurate pressure readings are obtainable and useable at least as high as 1,000 torr from this micropirani sensor 110.

One of the other resistive elements or filaments 174, 176 that is on the main body 112, but not on the membrane, i.e., has no contact with gas molecules, but stays the same temperature as the main body 112, is included in the micropirani bridge circuit 90 for reference and temperature stability. Essentially, that offset resistive element 174 or 176 provides a reference resistance that varies with temperature changes along with the two resistive elements 170, 172 on the membrane 118, and, when included in the bridge circuit, minimizes drift or variations in output signal voltage due to temperature changes as opposed to pressure changes. The other one of the filaments 174, 176 is used in a different, secondary temperature compensation portion of the circuit 80, which is not part of the micropirani bridge circuit, as will be discussed in more detail below.

A suitable micropirani sensor 110 can be obtained by modifying the sensor device described in U.S. Pat. No. 4,902,138, which is incorporated herein by reference, to function as micropirani sensor as described above.

Suitable piezo differential pressure sensor 200 for use in this invention are manufactured by Motorola, Inc., of Northbrook, Ill. and by Honeywell, Inc., of Morristown, N.J., as well as a number of other manufacturers. Since such piezo differential pressure sensors are readily available commercially, it is not necessary to describe all of the details of how such a piezo differential pressure sensor is fabricated and functions. Therefore, only enough explanation is provided to understand how such a piezo differential pressure sensor 200 functions in this invention.

Figure 12:
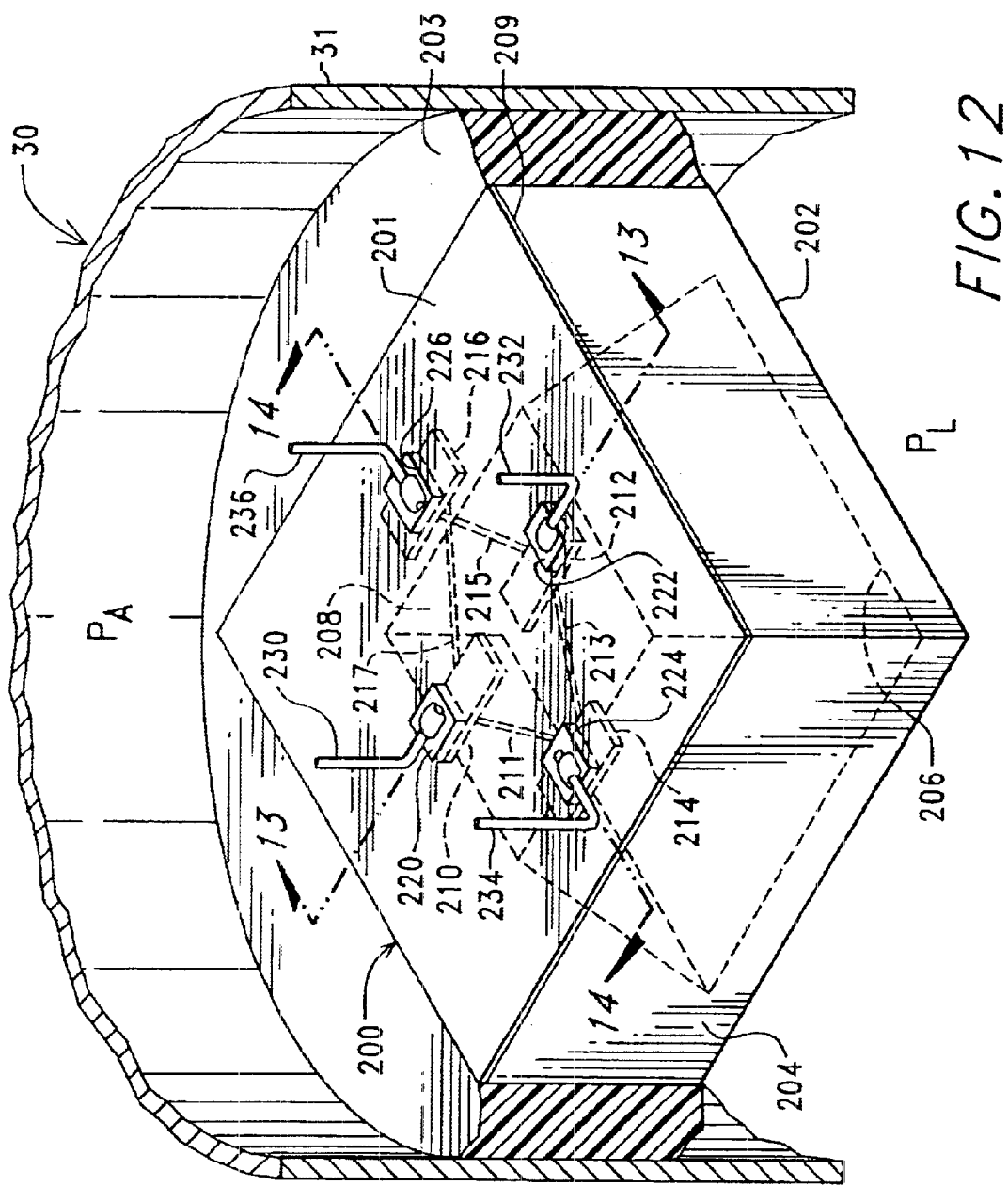
FIG. 12 is an enlarged isometric view of the piezo differential pressure sensor utilized in the preferred embodiment miniaturized pressure transducer of this invention as it is mounted and contained in a housing.

Therefore, with reference to FIGS. 2, 12, 13, and 14, the differential pressure sensor assembly 30 in FIG. 2 includes a piezo differential pressure sensor 200 (FIG. 12) enclosed by the housing 31 and sealed in a manner such that the top surface 201 is exposed only to ambient atmospheric pressure $P_A$ and the bottom surface 202 is exposed only to the pressure $P_L$ in the interior 61 of load lock 60 (FIG. 3). For example, as illustrated in FIG. 12, a suitable potting material 203, such as epoxy, can be used to mount the differential pressure sensor 200 in the housing 31.

Figure 13:
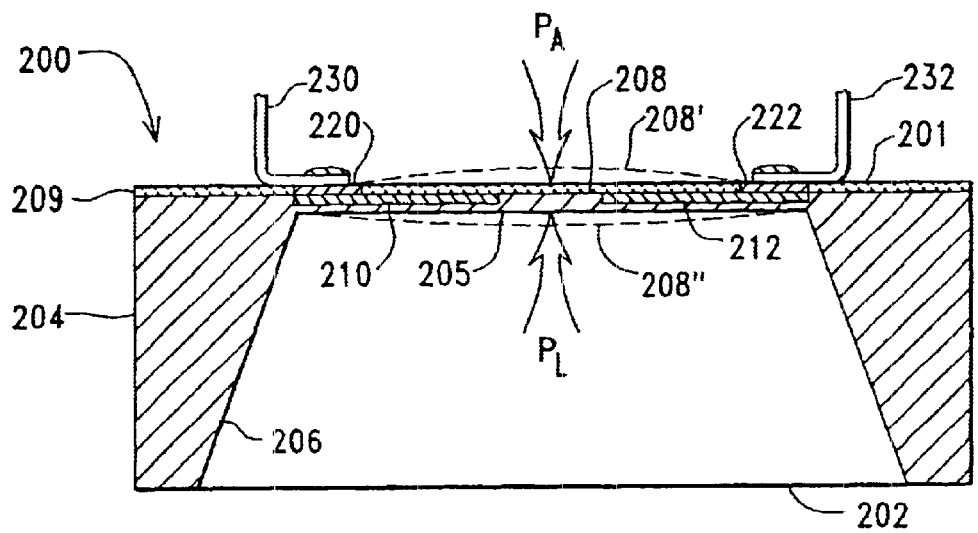
FIG. 13 is a diagrammatic cross-sectional view of the piezo differential pressure sensor of FIG. 12 taken along section line 13—13 of FIG. 12.
Figure 14:
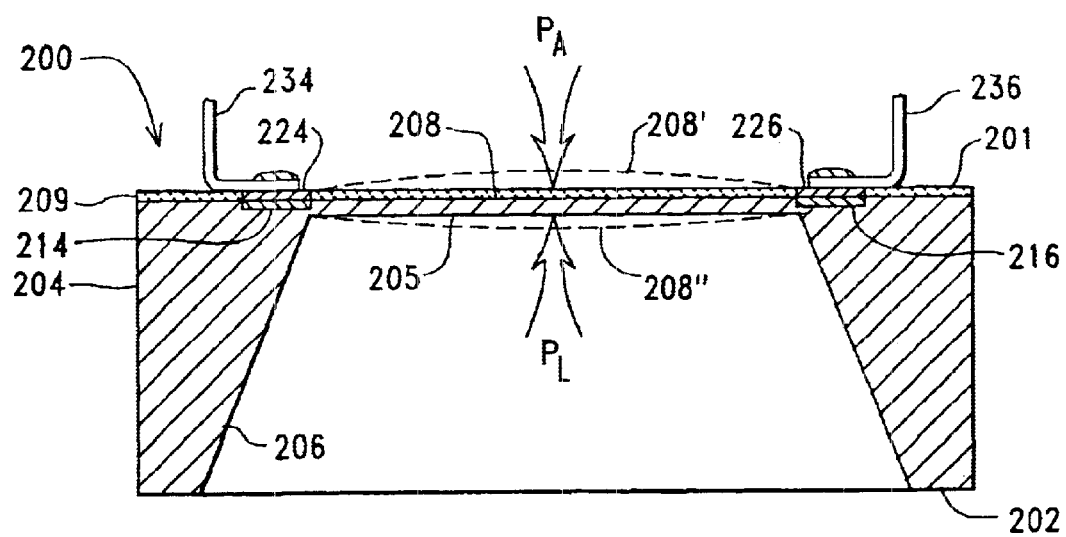
FIG. 14 is a diagrammatic cross-section view of the piezo differential pressure sensor of FIG. 12 taken along section line 14—14 of FIG. 12.

Referring now primarily to FIGS. 12, 13, and 14, the piezo differential pressure sensor 200 may comprise a main body 204, such as bulk silicon, with a cavity 206 etched into its bottom surface 202 and extending most of the way toward, but not all the way to, the top surface 201. One or more, preferably two, piezo resistive elements 210, 212 are implanted in a thin membrane portion 208 of the main body 204 that extends over the cavity 206. The piezo resistive elements 210, 212 can be doped semiconductor materials that respond to flexure in the membrane portion 208 with changes in electrical resistivity, as is known to persons skilled in the art and which are available in commercial models of the piezo differential pressure sensor 110, as described above. Preferably, at least one, and more preferably two, additional piezo resistive elements 214, 216 are embedded in the main body 204 adjacent, but not in, the membrane portion 208, so they do not flex when the membrane 208 and piezo resistive elements 210, 212 flex. The piezo resistive elements 210, 212, 214, 216 are connected by conductive traces 211, 213, 215, 217 to form a wheatstone bridge circuit. Conductive contacts 220, 222, 224, 226, preferably metal, such as gold, contact the respective piezo resistive elements 210, 212, 214, 216 and extend through a passivation film 209, such as silicon dioxide ($SiO_2$) to the top surface 201, where they are exposed. Therefore, leads 230, 232, 234, 236 can be soldered to the respective contact pads 220, 222, 224, 226 for electrical connection to the electric circuit 80 (FIGS. 2 and 4).

As best seen in FIG. 13, atmospheric pressure $P_A$ is applied to the top surface 201 of the membrane portion 208, while pressure $P_L$ of the interior 61 of the load lock 60 (FIG. 3) is applied to the bottom surface 205 of the membrane portion 208. If the load lock pressure $P_L$ is greater than the atmospheric pressure $P_A$, the membrane portion 208 will flex upwardly, as indicated by phantom line 208'. On the other, if the atmospheric pressure $P_A$ is greater than the load lock pressure $P_L$, the membrane portion 208 will flex downwardly, as indicated by phantom line 208". If both the atmospheric pressure $P_A$ and the load lock pressure are the same, i.e., $P_A = P_L$, then there will be no flexure of the membrane portion 208

Figure 15:
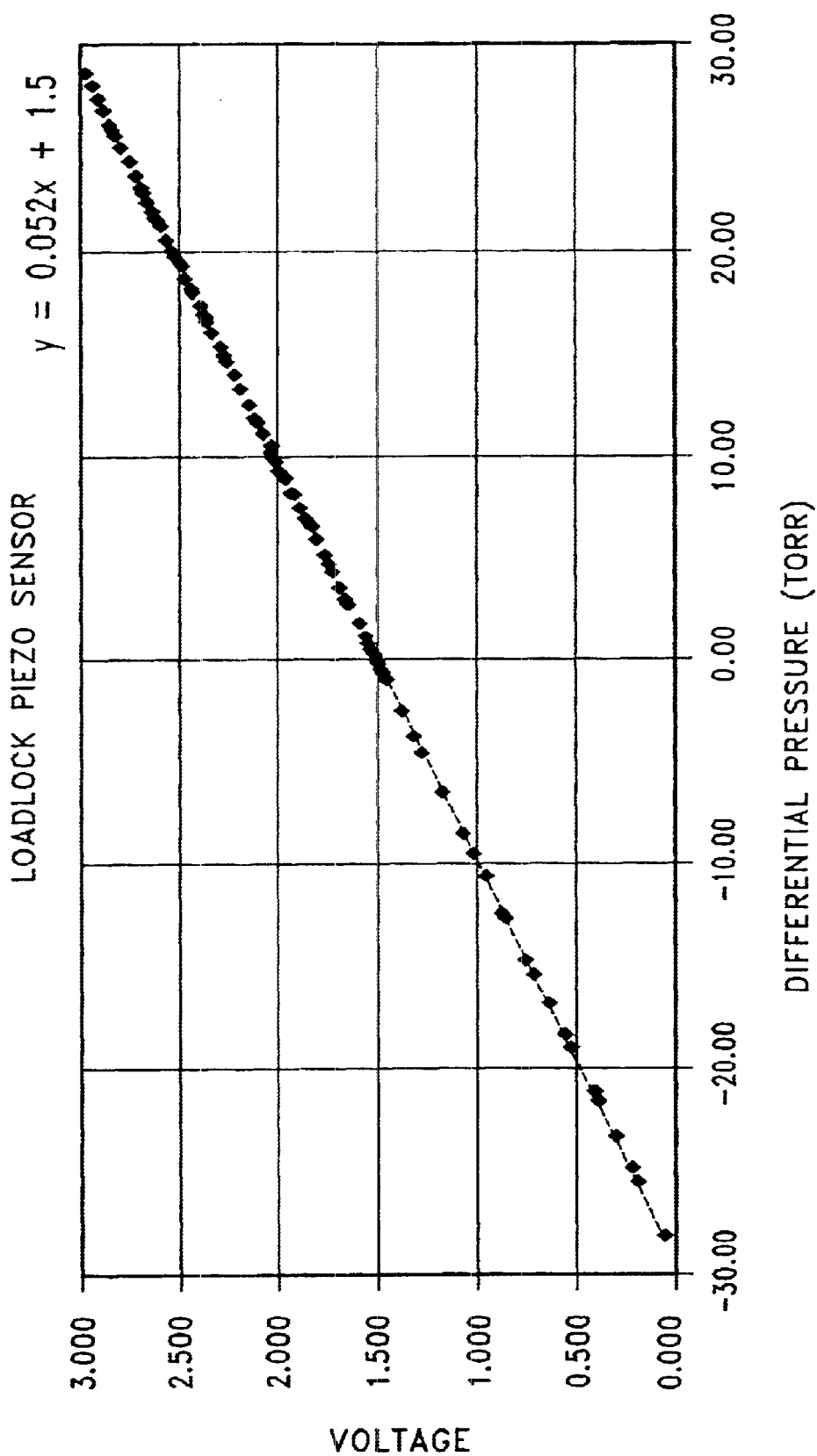
FIG. 15 is a chart showing the relationship between differential pressure and the voltage of the signal produced by the piezo differential pressure sensor and electric circuit.
Figure 16A:
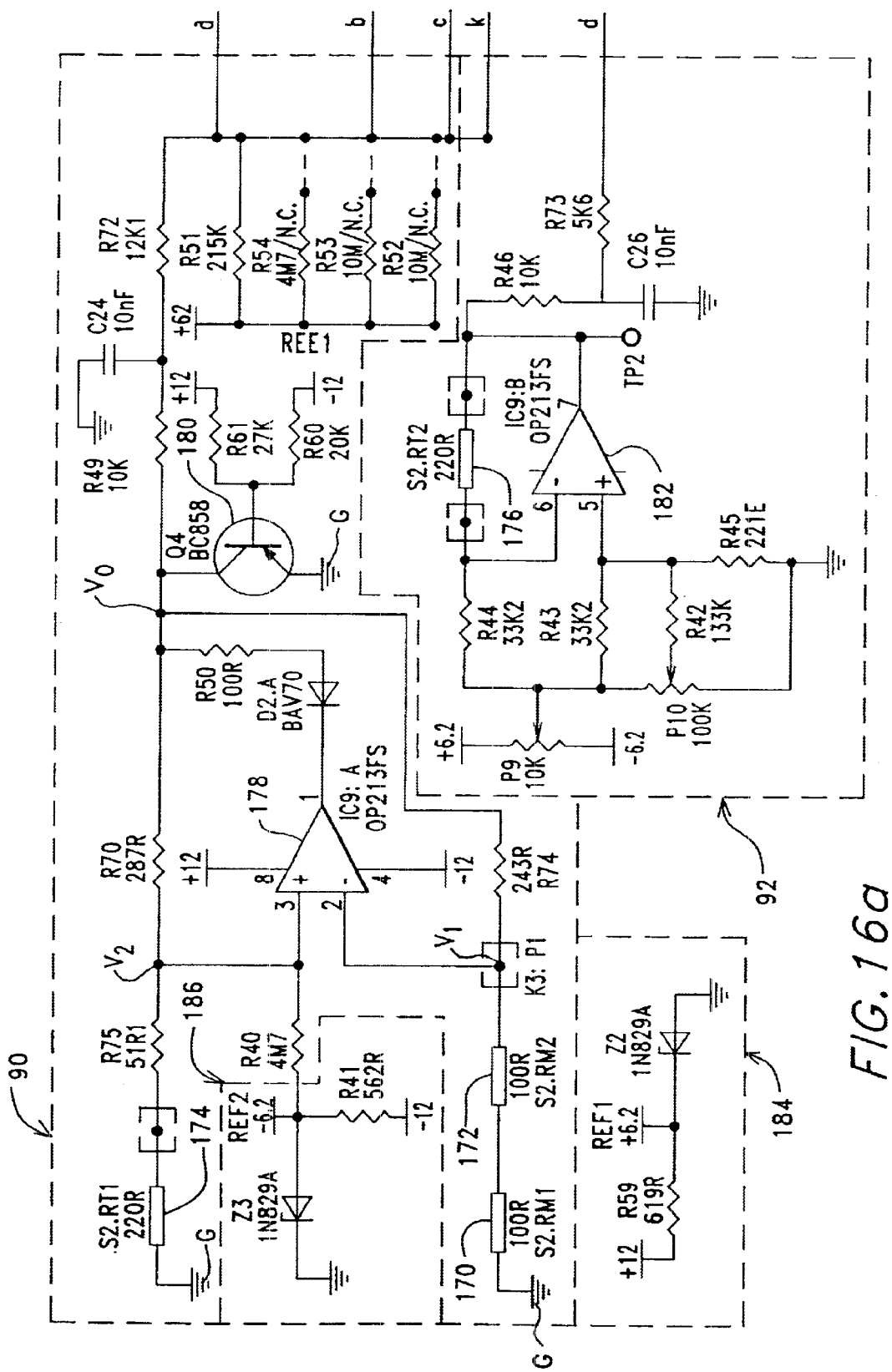
FIG. 16 is a schematic diagram of an electric circuit used to implement this invention.
Figure 16B:
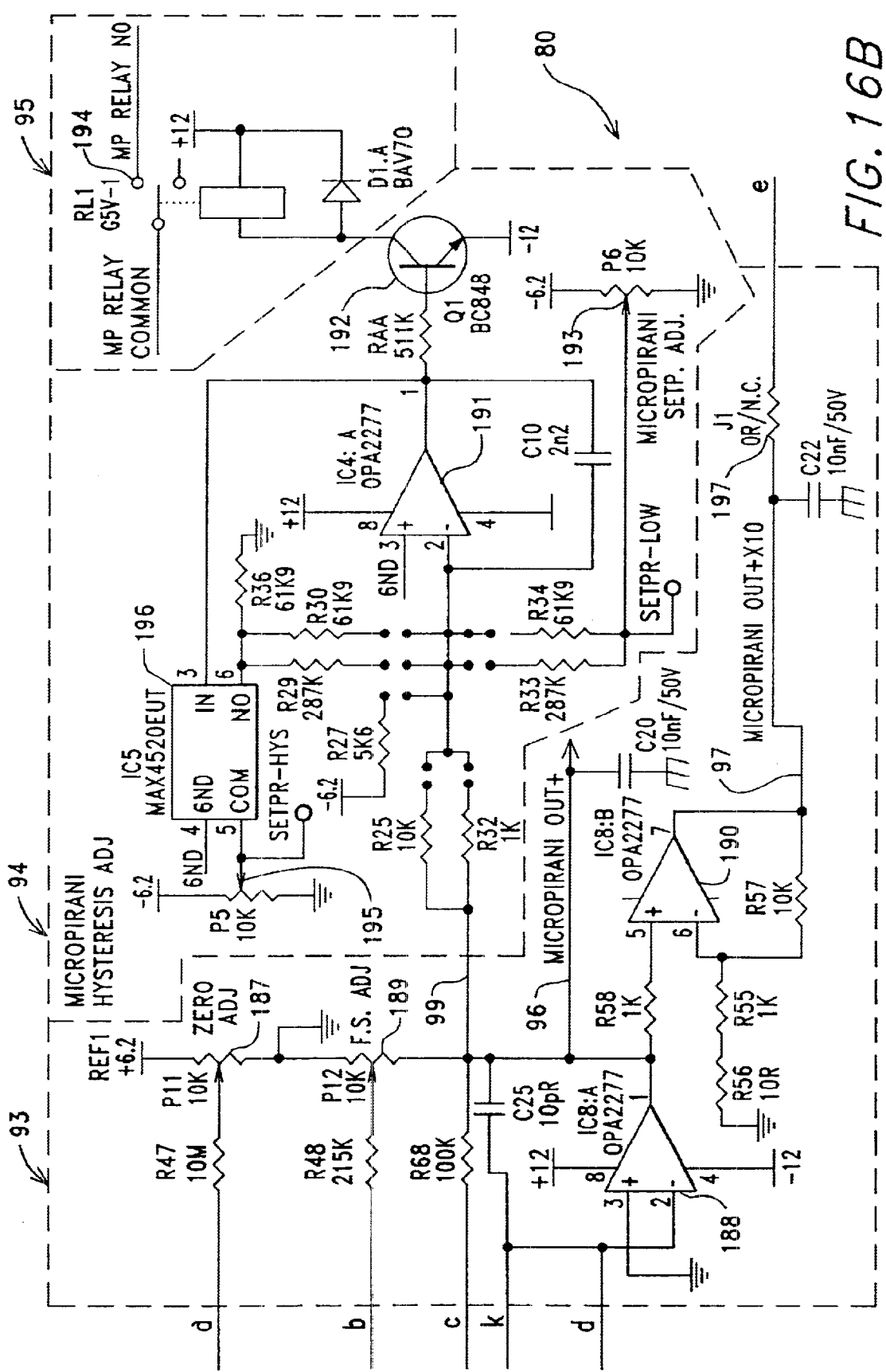
Figure 16C:
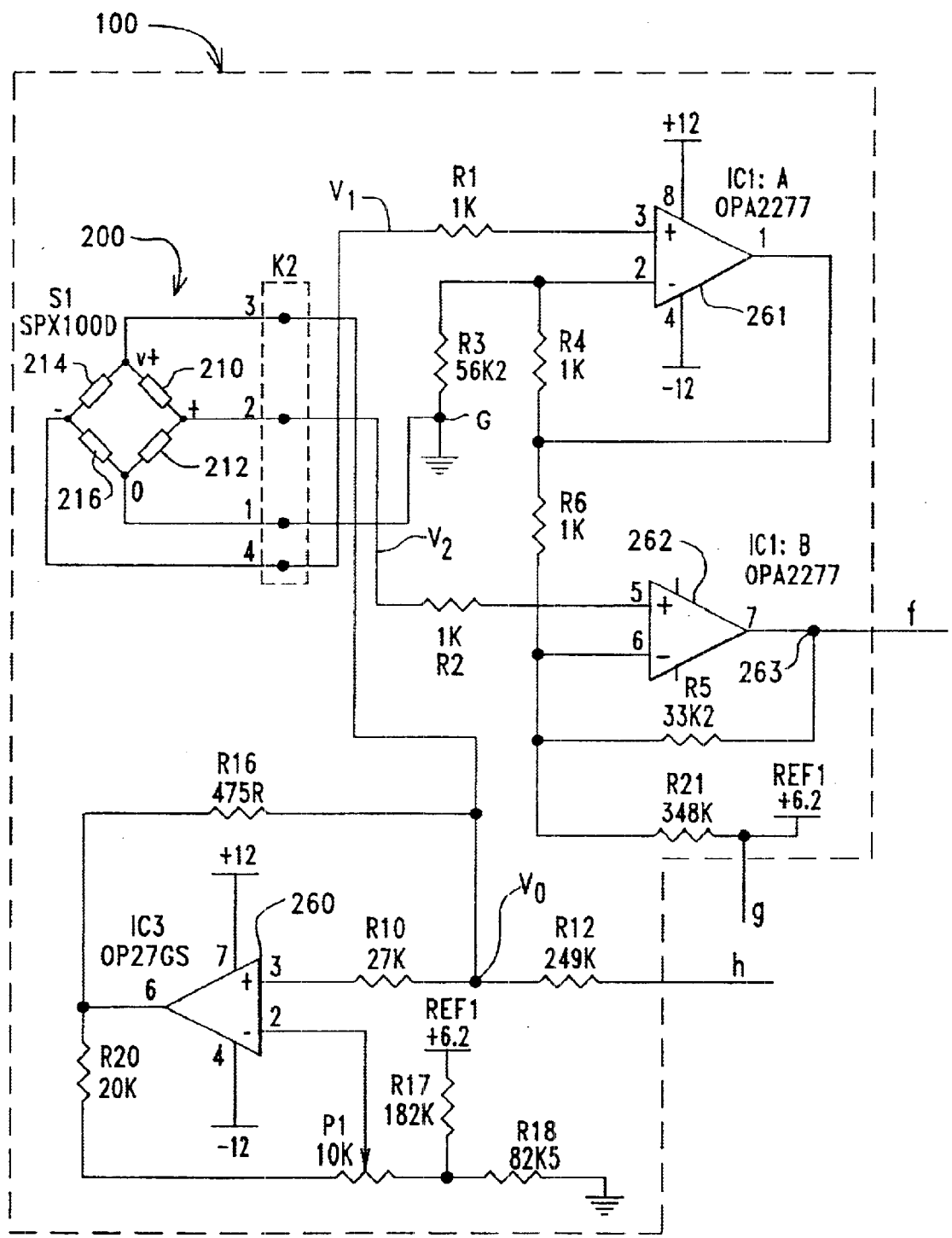
Figure 16D:
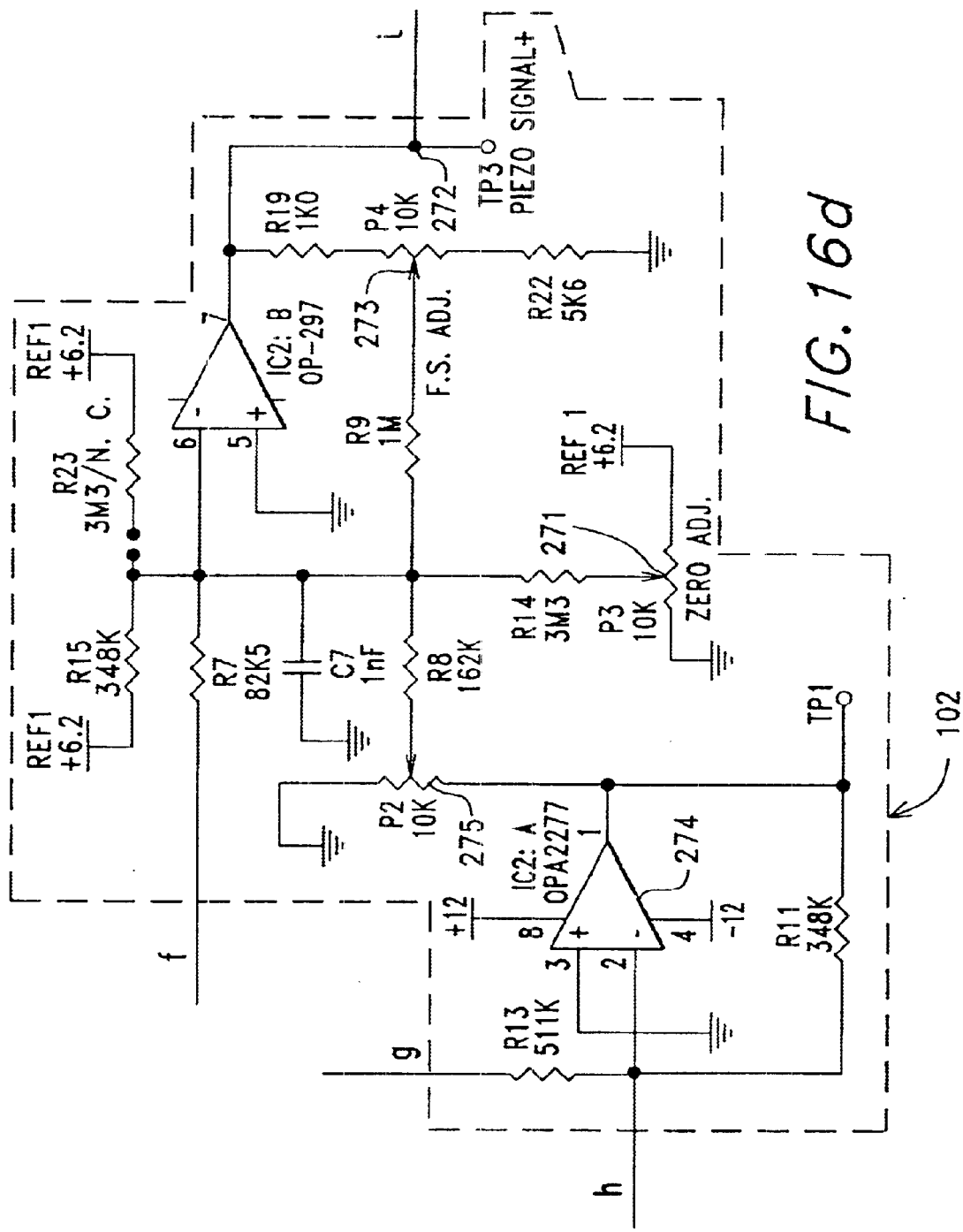
Figure 16E:
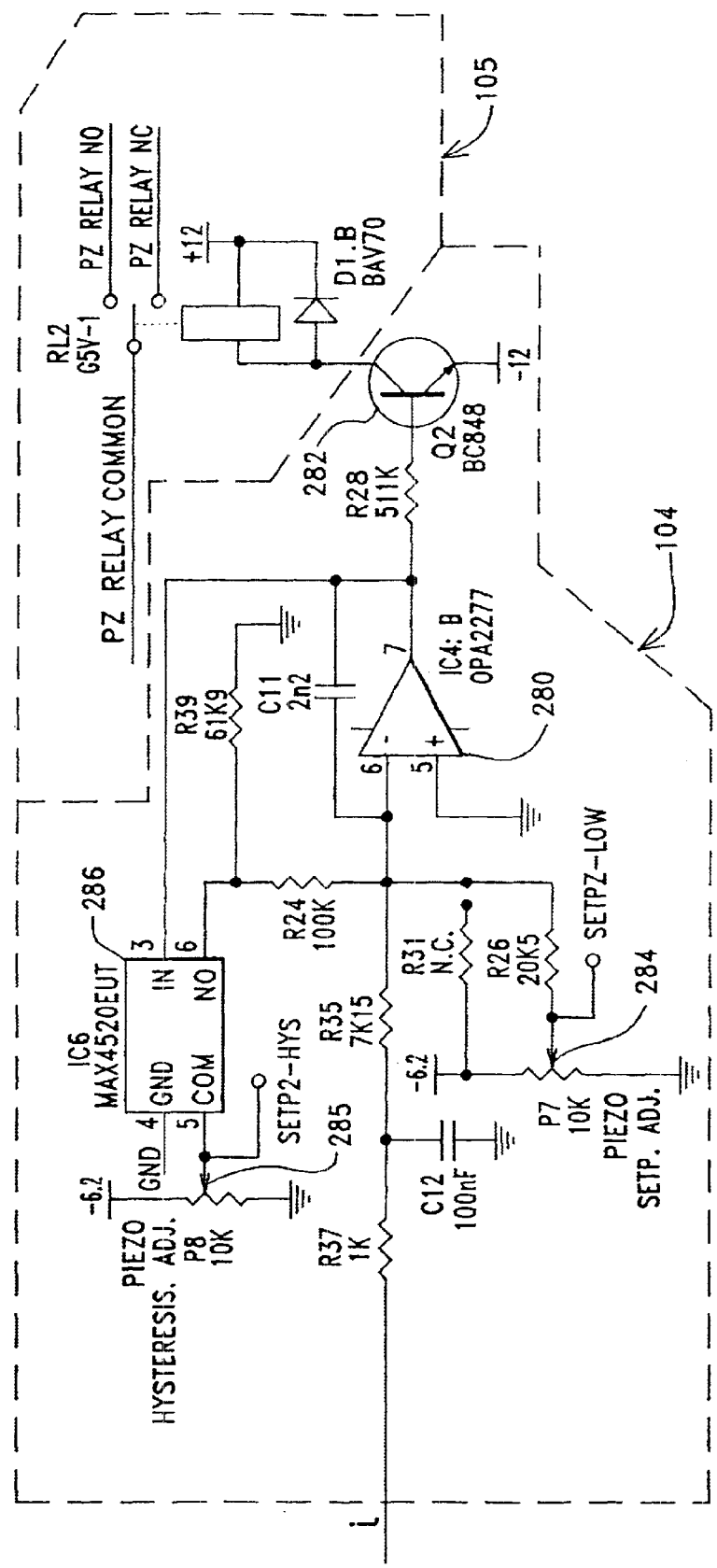
Figure 16F:
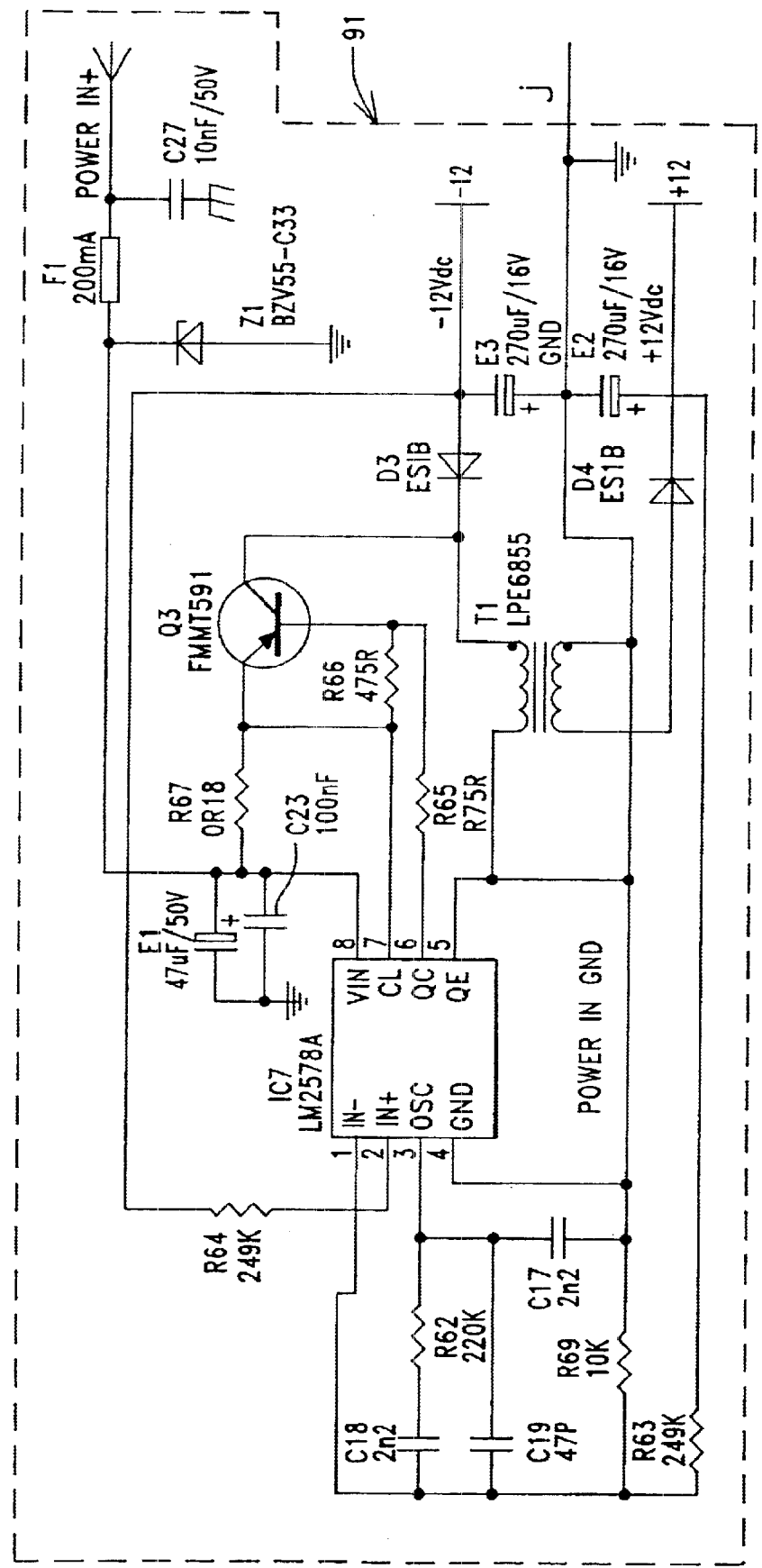
Figure 16G:
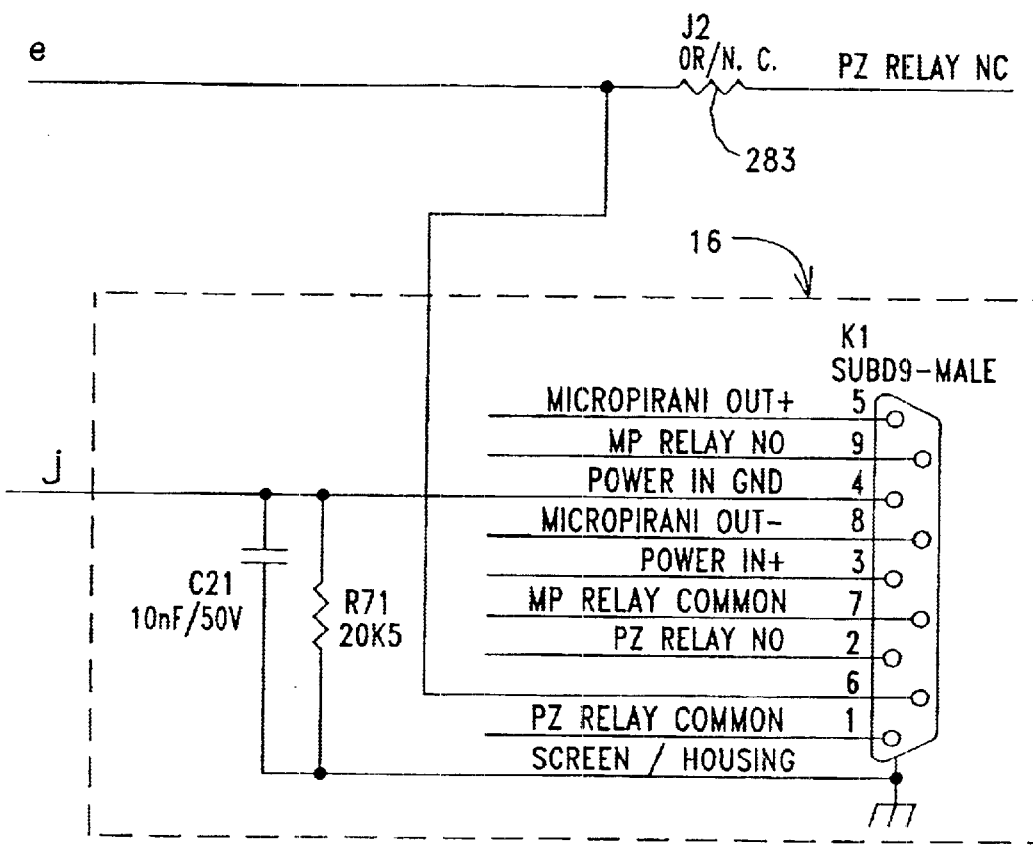
Figure 16G:
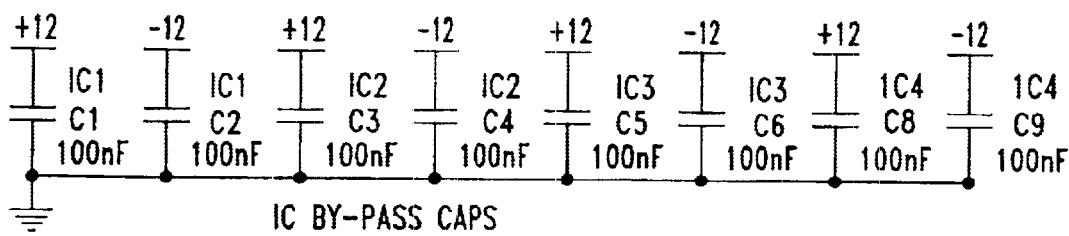
Figure 16G:
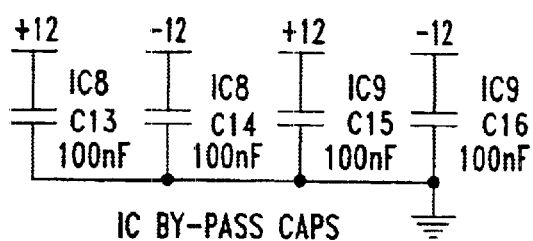

As the membrane portion 208 flexes either upwardly or downwardly, the two piezo resistive elements 210, 212 embedded in the membrane portion 208 also flex with the membrane portion 208. Such flexure causes the piezo resistive elements 210, 212 to undergo proportional changes in electrical resistivity, which can be detected and used by the electric circuit 80 (FIGS. 2 and 4) to generate control signals for the outer load lock door 62 (FIG. 3) at a preselected differential pressure, as will be explained in more detail below. The other two piezo resistive elements 214, 216, which are not in the membrane portion 108, do not flex, regardless of pressure differential between the atmospheric pressure $P_A$ and the load lock pressure $P_L$. Therefore, the piezo resistive elements 214, 216 provide reference voltages for use in the piezo bridge circuit 100 (FIG. 4). Also, since these reference piezo resistive elements 214, 216 are mounted in the main body 204 adjacent the membrane 208, they are essentially at the same temperature as the piezo resistive elements 210, 212. Therefore, any change in resistivity of the piezo resistive elements 210, 212 due to changes in temperature will be offset by comparable changes in resistivity in the reference piezo resistive elements 214, 216. Consequently, the signal output of the piezo bridge circuit 100 is quite insensitive to temperature changes. The graph in FIG. 15 shows an example of piezo output signal voltages for differential pressures ranging from about –28.00 torr to +28.00 torr. In that differential pressure range, the signal voltage is between 0.000 volts for –28.00 torr and 3.000 volts for about +28.00 torr, and, in that range, the voltage change to pressure change relationship is linear.

The leads 230, 232, 234, 236 are connected to the electric circuit board 12 by connection first to external pins 240, 242, 244, 246 extending from the side of the housing 31, as best seen in FIG. 7. Those external pins 240, 242, 244, 246 connect to traces in the bottom panel 17, which, in turn connect to pins 250, 252, 254, 256 that extend through bottom panel 17 to the main circuit board 12 (FIG. 2).

Figure 4:
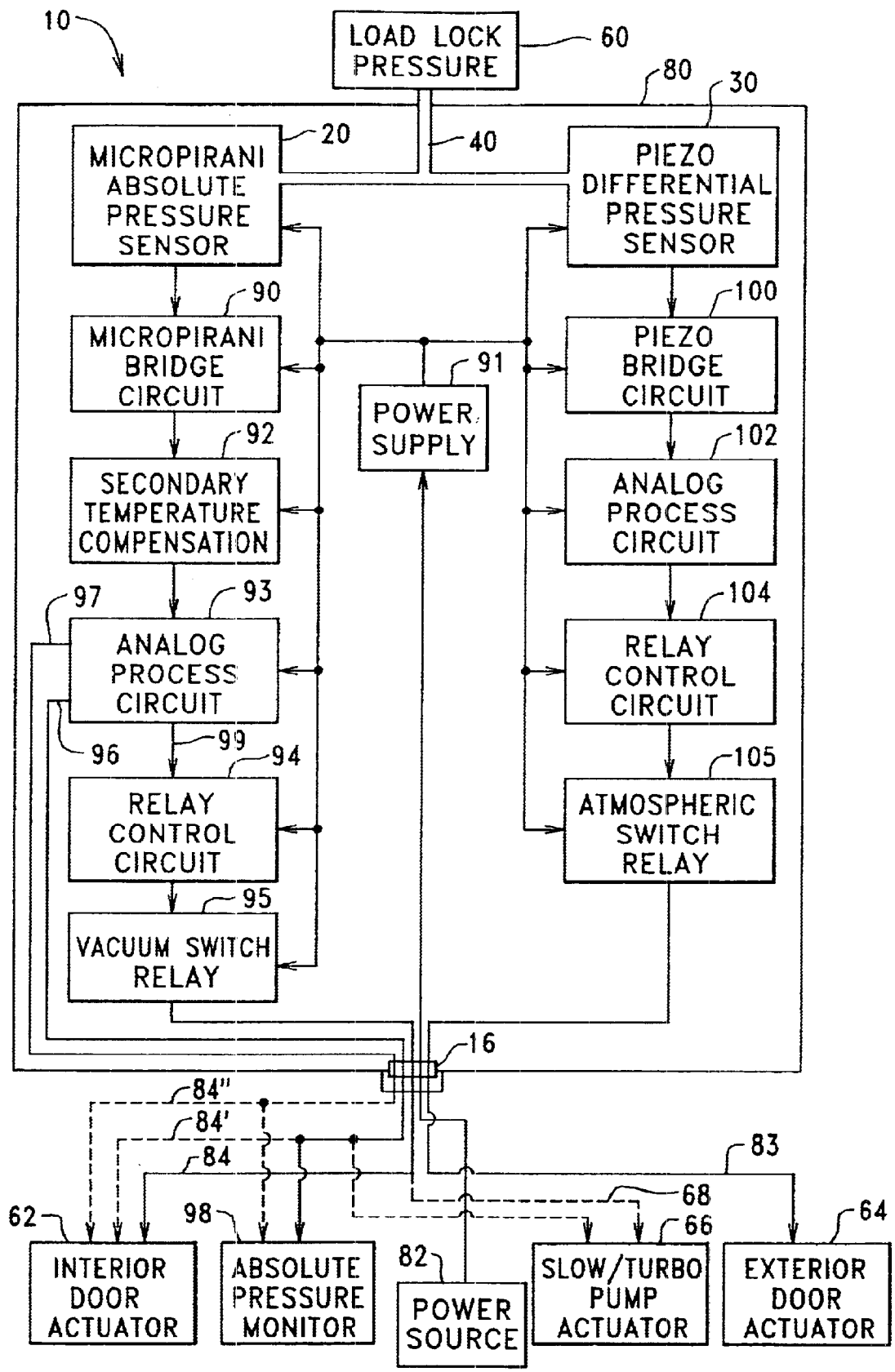
FIG. 4 is a function block diagram of an electronic control circuit for the miniaturized pressure transducer of this invention.

A schematic diagram of the electric circuit 80 on the circuit board 12 (FIGS. 2 and 4) is shown in FIG. 16 with portions of the circuit 80 that correspond to function blocks on FIG. 4 outlined in broken lines in FIG. 16, including the micropirani bridge circuit 90, secondary temperature compensation circuit 92, analog process circuit 93, relay control circuit 94, and vacuum switch relay 95, piezo bridge circuit 100, analog process circuit 102, relay control circuit 104, atmospheric switch relay 105, power supply 91, and connector 16. Persons skilled in the art will readily understand this electric circuit 80 from the functions and features described, but several salient features can be mentioned. The two resistive elements or filaments 170, 172 of the micropirani sensor 110 are shown in the micropirani bridge circuit 90, as is the one offset, temperature sensing, resistive element 174. The bridge comprises essentially, the filaments 170, 172 together between voltage nodes G (ground) and V.

As pressure in the load lock chamber 60 (FIG. 3), thus gas pressure adjacent the filaments 170, 172, decreases, conduction of heat from the filaments 170, 172 by gas molecules decreases. Such decrease in heat dissipation from the filaments 170, 172 would, in the absence of an adjustment, cause temperature of the filaments 170, 172, thus resistance of the filaments 170, 172, to increase. Such an increase in resistance of the filaments 170, 172 would change current flow in the bridge circuit 90 and cause the bridge voltages $V_1$ and $V_2$ to become unbalanced, i.e., $V_1$ would not equal $V_2$. Such unbalanced condition between $V_1$ and $V_2$ is detected by a voltage comparator 178, which drives the voltage in the bridge circuit 90. In response, the transistor controller 180 in the bridge circuit 90 lowers the voltage $V_0$ in the bridge circuit 90, which lowers the voltage $V_F$ across the filaments 170, 172, thus lowers current flow I through the filaments 170, 172. The lower current I in filaments 170, 172, lowers heat production in the filaments 170, 172, because production of heat requires power, and power equals $I^2R$. Less heat production means temperature of the filaments 170, 172 comes back down, thus resistance of the filaments 170, 172 comes back down, which readjusts current flow in the bridge circuit 90 back in balance, i.e., $V_1 = V2$ again.

Conversely, when load lock chamber 60 pressure, thus pressure adjacent the filaments 170, 172, increases, more gas molecules conduct more heat away from the filaments 170, 172, which, in the absence of an adjustment, would lower temperature, thus resistance, of the filaments 170, 172. Lower resistance in filaments 170, 172 would change current flow in the bridge circuit 90, thus causing the bridge circuit 90 to become unbalanced, i.e., $V_1$ would not equal $V_2$. Again, such imbalance is detected by the voltage comparator circuit 178, which causes the transistor controller 180 to increase $V_0$. The increased $V_0$ increases $V_F$ across the filaments 170, 172 to increase current I in the filaments 170, 172, which increases power ($I^2R$) to raise the temperature, thus resistance, of filaments 170, 172 to put the bridge circuit 90 back into balance, i.e., $V_1 = V_2$. Consequently, with these adjustments of the voltage $V_0$, the temperature of the filaments 170, 172 is kept constant. Further, such decreases and increases of the voltage $V_0$ required to maintain the filaments 170, 172 temperature constant, as explained above, are indicative of changes in load lock chamber 60 pressure.

The voltage $V_0$ can, therefore, with conditioning, amplification, and adjustment, as described below, be monitored electronically and used to actuate the relay control circuit 94 to generate and output a control signal on link 84 (FIGS. 3 and 4) to open the interior door 62, or to allow the interior door 62 to be opened, at some selected minimum load lock chamber 60 pressure level that matches or is near the pressure maintained in the process chamber 70. Optionally, as mentioned above, the voltage $V_0$ could also be used, after conditioning, amplification, and adjustment, to actuate the relay control circuit 94 or another relay control circuit (not shown) to generate and output a control signal on link 68 to the throttle valve 66 (FIGS. 3 and 4) to increase the effective pumping speed of the vacuum pump 65 after the load lock chamber 60 pressure is drawn down to some desired intermediate load lock chamber 60 pressure threshold.

Before the signal at the $V_O$ node is used for the purposes described above, though, some conditioning, amplifying, and adjusting is helpful. The capacitor C24 and resistor R49 combination filters noise out of the $V_O$ signal in the micropirani bridge circuit 90 prior to amplification in the analog process circuit 93. The resistors R51, R52, R53, R54 provide a capability to add resistors depending on characteristics of a particular micropirani sensor 110 (FIGS. 8–10). The fourth resistive element 176 of the micropirani sensor 110, which is not on the membrane 118 over the cavity 116 (FIGS. 9–10) is used along with a voltage comparator 182 in a secondary temperature compensation circuit 92, as shown in FIG. 16, to adjust the $V_O$ signal in a manner to compensate further for $V_O$ levels that are due to changes in ambient temperature rather than changes in load lock pressure $P_L$. The precision voltage regulators 184, 186 provide precision reference voltages (REF 1=+6.2 volts and REF 2=−6.2 volts) for use by the voltage comparator 182 in the secondary temperature compensation circuit 92.

In the analog process circuit 93, and amplifier 188 amplifies the $V_O$ signal from the micropirani bridge circuit 90, as adjusted by the secondary temperature compensation circuit 92, according to a formula Y=a+bx, where x is the secondary temperature compensated $V_O$, a is the zero offset adjust as set at 187, and b is the full scale span adjust as set at 189. In other words, the zero offset 187 is adjustable manually to set the amplified micropirani signal voltage at the desired level to correspond with a particular absolute pressure $P_L$ range, e.g., 0.0001 volt for $10^{-5}$ torr to 10.000 volts for 760 torr, as shown in the chart of FIG. 11. Therefore, the amplified micropirani signal at node or link 96 in FIG. 16, as illustrated in the FIG. 11 chart, is indicative of absolute pressure $P_L$ in the interior 61 of the load lock 60 (FIG. 4) and is provided at output link 96 in circuit 80 (FIGS. 4 and 16) for use by external circuits and/or controllers, such as the absolute pressure monitor 98 (FIG. 4), slow/turbo pump actuator 66, interior door actuator 62, and the like, as explained above. An auxiliary amplifier 190 in FIG. 16 provides a further amplified signal, e.g., ten times the output signal of primary amplifier 188, on an auxiliary link 97 for use in very low absolute pressure zones, such as below $10^{-4}$ torr, where the primary amplified signal on link 96 from the primary amplifier 188 is too weak for accurate monitoring and use, as also explained above. The third link 99 from the analog process circuit feeds the primary amplified signal from the primary amplifier 188 to the relay control circuit 94 for use in operating the vacuum relay switch 95.

In the relay control circuit 94, an op amp 191 uses the amplified absolute pressure signal on link 99 from the analog process circuit 93 to drive a transistor switch 192 to output an on or off signal to the vacuum switch relay 95, which can be used to operate the interior door 62 actuator (FIGS. 3 and 4) or the slow/turbo pump actuator 66 (FIGS. 3 and 4), as described above. However, before the absolute pressure signal on link 99 in FIG. 16 is used by the op amp 191 for that purpose, it is adjusted in several ways. First, there is a set point adjustment 193, as shown in FIG. 16, which sets the absolute pressure at which the relay switch 95 is to be actuated. For example, if it is desired to use the relay switch 95 to operate the interior door 62 actuator (FIGS. 3 and 4) at, e.g., $10^{-4}$ torr, this set point adjustment 193 in FIG. 16 can be used to set $10^{-4}$ torr as the pressure at which the transistor 192 will operate the relay switch 95 to close the normally open (NO) contact 194 in vacuum relay switch 95 to send an actuator signal to the interior door 62 actuator. Alternatively, if it is desired to use the relay switch 95 to operate the slow/turbo pump actuator 66 at, e.g., 1 torr, this set point adjustment 193 can be used to set 1 torr as the pressure at which the transistor 192 will operate the relay switch 95 to close the normally open (NO) contact 194 in vacuum relay switch 95 to send an actuator signal to the slow/turbo pump actuator 66.

A hysteresis adjustment 195 with a hysteresis circuit IC 196 can be used to set a hysteresis, i.e., pressure range around the set point pressure described above, in which the op amp 191 will drive the transistor 192 to deactuate the vacuum relay switch 95 after it has been actuated. For example, if the vacuum relay switch 95 is set to actuate the turbo pump mode at 1 torr, as discussed above, the hysteresis adjustment 195 can be set so that the vacuum relay switch 95 will not be deactuated until the pressure rises to 5 torr, which prevents the op amp 191 and transistor 192 from dithering or chattering the vacuum relay switch on and off at or near the 1 torr set point.

The piezo differential pressure sensor 200, with its four resistive elements 210, 212, 214, 216 is shown schematically in circuit 80 in FIG. 16 as part of the piezo bridge circuit 100, whereby two of the resistive elements 210, 212, which are mounted in the flexible membrane 208 (FIGS. 12–14) increase with positive pressure or vice versa while two resistive elements 214, 216 do not change, as described above. The resulting output voltage $V_O$ of the bridge circuit 100 in FIG. 16 is indicative of the differential pressure across the membrane 208. The op amp 260 functions as a buffer and drives the voltage for the piezo bridge of elements 210, 212, 214, 216. Op amps 261, 262 determine voltage differences in the bridge points and output the piezo bridge signal on node 263, which is indicative of differential pressure between atmospheric pressure $P_A$ and load lock pressure $P_L$ across the membrane 208.

In the analog process circuit 102 in FIG. 16, the piezo bridge circuit output signal from node 263 is amplified by amplifier 270 for use in the relay control circuit 104. It is also zero adjusted at 271 to set the amplified voltage at which zero differential pressure is indicated at the amplifier output 272, e.g., 1.5 volts in the graph of FIG. 15. The signal is also full scale adjusted at 273 to set the scale of the amplified signal over its span or range, e.g., 0.000 volts for −30 torr to 3.000 volts for +30 torr in the graph of FIG. 15. These zero and full scale adjustments can be made manually, as desired by an operator. The amplified voltage signal output at node 272 is the signal charted in FIG. 15. The op amp 274 and potentiometer 275 are used for piezo temperature compensation.

The relay control circuit 104 for the atmospheric switch relay 105 of circuit 80 in FIG. 16 functions in a similar manner to the relay control circuit 94 described above for the vacuum switch relay 95. The amplified piezo output signal at node 272 is used by op amp 280 to drive transistor switch 282 in "on" or "off" mode to actuate the atmosphere relay switch 105 to output a control signal for the exterior door 64 actuator, as described above and shown in FIGS. 3 and 4. This relay 105, as shown in FIG. 16, has both a normally open (NO) contact and a normally closed (NC) contact, either of which can be used for the output control signal to the exterior door 64 actuator, depending on how the exterior door 64 actuator is configured. Because of the limited number of connecting pins (nine) in the connector 16 illustrated in FIG. 16, the circuit 80 has been arranged so that either the NO or the NC, but not both, can be provided at the connector 16. For example, if the NC mode is used, the resistor 283 has to be in place, and the resistor 197 in the auxiliary micropirani output link 97 of the micropirani analog process circuit 93 would have to be removed, because they cannot both be output on pin 6 of the connector 16 at the same time. Of course, there are many other options, such as a larger connector 16 with more connector pins could be used to output all of the signals simultaneously, or the NO and NC modes of the vacuum switch relay could be set up as alternatives on the pin 2 of connector 16, as would be within the capabilities of persons skilled in the art. The set point adjustment is used to manually set the voltage at which the op amp 280 and transistor actuate the vacuum switch relay 105 to correspond with the differential pressure at which it is desired to open the exterior door 64 (FIGS. 3 and 4). For example, if it is desired to open the exterior door 64 when the differential pressure is +10 torr, i.e., ambient pressure $P_A$ is 10 torr less than load lock pressure $P_L$, the set point adjustment 284 can be set manually to make that result. The hysteresis adjustment 285 in conjunction with the hysteresis circuit IC 286 set a range from the set point differential pressure in which the op amp 280 and transistor 282 will not reverse a relay control signal to the atmospheric switch relay 105. For example, if the set point for the atmospheric switch relay 105 to open the exterior door 64 is −10 torr, then the hysteresis adjustment can be set so that the atmospheric switch relay 105 holds that state until the pressure differential rises to −5 torr. This feature prevents the op amp 280 and transistor 282 from dithering and chattering the atmospheric relay switch rapidly on and off.

The foregoing description is considered as illustrative only of the principles of the invention. Furthermore, since numerous modifications and changes will readily occur to those skilled in the art, it is not desired to limit the invention to the exact construction and process shown and described above. Accordingly, resort may be made to all suitable modifications and equivalents that fall within the scope of the invention. The words "comprise," "comprises," "comprising," "include," "including," and "includes" when used in this specification are intended to specify the presence of stated features, integers, components, or steps, but they do not preclude the presence or addition of one or more other features, integers, components, steps, or groups thereof. The term "about", when used in relation to pressure, means within a range of plus or minus 100 torr.

The embodiments of the invention in which an exclusive property or privilege is claimed are defined, as follows:

1. In load lock apparatus for facilitating transfer of parts between a room at ambient atmospheric pressure and a vacuum processing chamber maintained at a pressure less than one (1) torr, wherein the load lock apparatus has an evacuatable load lock chamber, an exterior door positioned between the load lock chamber and the room, a interior door positioned between the load lock chamber and the processing chamber, a exterior door actuator that is responsive to an exterior door control signal to open or close the exterior door, an interior door actuator that is responsive to an interior door control signal to open or close the interior door, and a vacuum pump connected to the load lock chamber for evacuating the load lock chamber, the improvement comprising:

a combination differential and absolute pressure transducer with (i) a manifold connected in fluid flow relation to the load lock chamber so that pressure in the manifold is equal to pressure in the load lock chamber, (ii) a differential pressure sensor that is capable of sensing a pressure difference between a first side of the differential pressure sensor and a second side of the differential pressure sensor, said differential pressure sensor being connected to the manifold and mounted such that said first side is exposed to the ambient atmospheric pressure in the room and such that the second side is exposed to pressure in the manifold, (iii) a differential pressure transducer circuit connected to the differential pressure sensor and which is capable of generating an exterior door control signal at a preset differential pressure value, (iv) an absolute pressure sensor that is capable of sensing absolute pressure, said absolute pressure sensor being connected to the manifold in such a manner that the absolute pressure sensor is exposed to pressure in the manifold, and (v) an absolute pressure transducer circuit connected to the absolute pressure sensor and which is capable of generating an interior door control signal at a preset absolute pressure value;

an exterior door control link connected between the differential pressure transducer circuit and the exterior door actuator, said exterior door control link being capable of delivering exterior door control signals generated by the differential pressure transducer circuit to the exterior door actuator; and an interior door control link connected between the absolute pressure transducer circuit and the interior door actuator, said interior door control link being capable of delivering interior door control signals generated by the absolute pressure transducer circuit from the to the interior door actuator.

2. The improvement of claim 1, wherein the absolute pressure sensor of the combination differential and absolute pressure transducer comprises a pirani sensor with a resistivity that varies as a function of pressure in the manifold, and wherein the absolute pressure transducer circuit includes a pirani bridge circuit that incorporates the pirani sensor as a resistive element in the bridge circuit, an analog process circuit connected to the pirani bridge circuit to adjust voltage across the pirani sensor as pressure in the manifold varies and thereby keep the bridge circuit in balance, and a relay control circuit that monitors voltage across the pirani sensor and generates the interior door control signal when the voltage across the pirani sensor is at a value that corresponds with said preset absolute pressure value.

3. The improvement of claim 1, wherein the differential pressure sensor of the combination differential and absolute pressure transducer comprises a capacitance manometer pressure sensor in which a capacitance varies as a function of differential pressure across a diaphragm that is positioned with the manifold pressure on one side of the diaphragm and ambient atmospheric pressure of the room on another side of the diaphragm, and wherein the differential pressure transducer circuit includes a sensor control circuit that is capable of converting the capacitance to a voltage that corresponds in value to the differential pressure across the diaphragm, and a relay control circuit that monitors the voltage from the sensor control circuit and generates the exterior door control signal when the voltage of the sensor control circuit corresponds with said preset differential pressure value.

4. Combination differential and absolute pressure transducer apparatus for controlling a load lock that facilitates transfer of parts between a room at ambient atmospheric pressure and a vacuum processing chamber maintained at a pressure less than one (1) torr and that has an evacuatable load lock chamber, an exterior door positioned between the load lock chamber and the room, a interior door positioned between the load lock chamber and the processing chamber, a exterior door actuator that is responsive to an exterior door control signal to open or close the exterior door, an interior door actuator that is responsive to an interior door control signal to open or close the interior door, and a vacuum pump connected to the load lock chamber for evacuating the load lock chamber, wherein combination differential and absolute pressure transducer comprises:

a differential pressure sensor that is capable of sensing a pressure difference between a first side of the differential pressure sensor and a second side of the differential pressure sensor, said differential pressure sensor being connected in fluid flow relation to the load lock chamber and mounted such that said first side is exposed to the ambient atmospheric pressure in the room and such that the second side is exposed to pressure in the load lock chamber;

a differential pressure transducer circuit connected to the differential pressure sensor and which is capable of generating an exterior door control signal at a preset differential pressure value;

an absolute pressure sensor that is capable of sensing absolute pressure, said absolute pressure sensor being connected in fluid flow relation to the load lock chamber in such a manner that the absolute pressure sensor is exposed to pressure in the load lock chamber;

an absolute pressure transducer circuit connected to the absolute pressure sensor and which is capable of generating an interior door control signal at a preset absolute pressure value.

5. The combination differential and absolute pressure transducer apparatus of claim 4, including:

an exterior door control link connected between the differential pressure transducer circuit and the exterior door actuator, said exterior door control link being capable of delivering exterior door control signals generated by the differential pressure transducer circuit to the exterior door actuator; and an interior door control link connected between the absolute pressure transducer and the interior door actuator, said interior door control link being capable of delivering interior door control signals generated by the absolute pressure transducer circuit to the interior door actuator.

6. The combination differential and absolute pressure transducer apparatus of claim 4, wherein the absolute pressure sensor comprises a pirani sensor with a resistivity that varies as a function of pressure in the load lock chamber, and wherein the absolute pressure transducer circuit includes a pirani bridge circuit that incorporates the pirani sensor as a resistive element in the bridge circuit, an analog process circuit connected to the pirani bridge circuit to adjust voltage across the pirani sensor as pressure in the load lock chamber varies and thereby keep the bridge circuit in balance, and a relay control circuit that monitors voltage across the pirani sensor and generates the interior door control signal when the voltage across the pirani sensor is at a value that corresponds with said preset absolute pressure value.

7. The combination differential and absolute pressure transducer apparatus of claim 4, wherein the differential pressure sensor of the combination differential and absolute pressure transducer comprises a capacitance manometer pressure sensor in which a capacitance varies as a function of differential pressure across a diaphragm that is positioned with the load lock chamber pressure on one side of the diaphragm and ambient atmospheric pressure of the room on another side of the diaphragm, and wherein the differential pressure transducer circuit includes a sensor control circuit that is capable of converting the capacitance to a voltage that corresponds in value to the differential pressure across the diaphragm, and a relay control circuit that monitors the voltage from the sensor control circuit and generates the exterior door control signal when the voltage of the sensor control circuit corresponds with said preset differential pressure value.

8. A method of automatically controlling a load lock that facilitates transfer of parts between a room at ambient atmospheric pressure and a vacuum processing chamber maintained at a pressure less than one (1) torr and that has an evacuatable load lock chamber, an exterior door positioned between the load lock chamber and the room, a interior door positioned between the load lock chamber and the processing chamber, a exterior door actuator that is responsive to an exterior door control signal to open or close the exterior door, an interior door actuator that is responsive to an interior door control signal to open or close the interior door, and a vacuum pump connected to the load lock chamber for evacuating the load lock chamber, comprising:

sensing differential pressure between the load lock chamber and the ambient pressure in the room;

transducing the sensed differential pressure to a voltage that corresponds in value to the sensed differential pressure;

producing a differential pressure reference voltage that corresponds in value to the voltage that is transduced from the differential pressure when the differential pressure is at a desired differential pressure value for opening the exterior door;

comparing the differential pressure reference voltage to the transduced voltage that corresponds in value to the differential pressure, and, when the transduced voltage equals the differential pressure reference voltage, producing the exterior door control signal and delivering the exterior door control signal to the exterior door actuator sensing absolute pressure in the load lock chamber;

transducing the sensed absolute pressure to a voltage that corresponds in value to the absolute pressure;

producing an absolute pressure reference voltage that corresponds in value to the voltage that is transduced from the absolute pressure when the absolute pressure is at a desired absolute pressure for opening the interior door;

comparing the absolute pressure reference voltage to the transduced voltage that corresponds in value to the voltage that is transduced from the absolute pressure when the absolute pressure is at a desired absolute pressure value for opening the interior door; and comparing the absolute pressure reference voltage to the transduced voltage that corresponds in value to the absolute pressure, and, when the transduced voltage equals the absolute pressure reference voltage, producing the exterior door control signal and delivering the interior door control signal to the interior door actuator.

9. A method of automatically controlling a load lock that facilitates transfer of parts between a room at ambient atmospheric pressure and a vacuum processing chamber maintained at a pressure less than one (1) torr and that has an evacuatable load lock chamber, an exterior door positioned between the load lock chamber and the room, a interior door positioned between the load lock chamber and the processing chamber, a exterior door actuator that is responsive to an exterior door control signal to open or close the exterior door, an interior door actuator that is responsive to an interior door control signal to open or close the interior door, and a vacuum pump connected to the load lock chamber for evacuating the load lock chamber, comprising:

predetermining a desired differential pressure value at which to open the external door, and predetermining a desired absolute pressure value at which to open the internal door;

sensing actual differential pressure between the load lock chamber and the ambient pressure in the room;

comparing the actual differential pressure to the predetermined differential pressure value, and, when the actual differential pressure equals the predetermined differential pressure value, producing the exterior door control signal and delivering the exterior door control signal to the exterior door actuator;

sensing actual absolute pressure in the load lock chamber; and comparing the actual absolute pressure to the predetermined absolute pressure value, and, when the actual absolute pressure equals the predetermined absolute pressure value, producing the interior door control signal and delivering the interior door control signal to the interior door actuator.

10. In a combination differential and absolute pressure transducer for controlling an exterior door and an interior door of a load lock chamber used to facilitate transfer of parts between a room at ambient atmospheric pressure and a vacuum processing chamber maintained at a pressure less than one (1) torr by matching load lock pressure to atmospheric pressure $P_A$ when the exterior door is to be opened and matching load lock pressure to the pressure in the vacuum processing chamber when the interior door is to be opened, wherein the combination differential and absolute pressure transducer has (i) a manifold connected in fluid flow relation to the load lock chamber so that pressure in the manifold is equal to pressure in the load lock chamber, (ii) a differential pressure sensor connected to the manifold and being configured for sensing and outputting a differential pressure signal that is indicative of pressure differential between atmospheric pressure and load lock pressure in the manifold and load lock chamber (iii) a differential pressure transducer circuit connected electrically to the differential pressure sensor and being capable of generating an exterior door control signal at a preset differential pressure value for opening or allowing opening of the exterior door, (iv) an absolute pressure sensor connected to the manifold for sensing and outputting an absolute pressure signal that is indicative of absolute pressure in the manifold and load lock chamber; and (v) an absolute pressure transducer circuit connected electrically to the absolute pressure sensor and being capable of generating an interior door control signal at a preset absolute pressure value for opening or allowing opening of the interior door, an improvement comprising:

a miniaturized combination differential and absolute pressure transducer in which the differential pressure sensor and the absolute pressure sensor are mounted and electrically connected in an integral manner to a printed circuit board that contains the differential pressure transducer circuit and the absolute pressure transducer circuit, and wherein the printed circuit board is attached to a manifold in a manner that seals the differential pressure sensor and the absolute pressure sensor to the manifold in fluid flow communication with ducts in the manifold that are adapted to be in fluid flow communication with the load lock chamber when the manifold is connected to the load lock chamber.

11. The improvement of claim 10, wherein the ducts in the manifold extend between a top surface and a bottom opeining surrounded by a connector, which is configured to connect the manifold to the load lock chamber, and wherein the printed circuit board is connected with screws to the top surface of the manifold in a manner that snugs the differential pressure sensor and the absolute pressure sensor between the printed circuit board and the top surface of the manifold with the differential pressure sensor positioned in alignment with one of the ducts and the absolute pressure sensor positioned in alignment with the other one of the ducts.

12. The improvement of claim 11, including an o-ring seal positioned around said one of said ducts and squeezed between the differential pressure sensor on the printed circuit board and the top surface of the manifold.

13. The improvement of claim 11, including an o-ring seal positioned around said other one of said ducts and squeezed between the absolute pressure sensor on the printed circuit board and the top surface of the manifold.

14. The improvement of claim 10, wherein the printed circuit board includes a bottom panel that is substantially parallel to the top surface of the manifold, and wherein the differential pressure sensor and the absolute pressure sensor are mounted on said bottom panel, electrically conductive traces in the bottom panel connect the differential pressure sensor to the differential pressure transducer circuit, electrically conductive traces in the bottom panel connect the absolute pressure sensor to the absolute pressure transducer circuit, and screws extending through the bottom panel connect the printed circuit board with the differential and absolute pressure sensors to the manifold.

15. The improvement of claim 10, wherein the absolute pressure sensor is a micropirani pressure sensor comprising: a substrate with a cavity in the substrate; a dielectric film membrane extending over and coveringthe cavity with at least one pressure equalization hole extending through the membrane to the cavity to equalize pressures over and under the membrane; at least one electrically resistive element deposited on the membrane; and at least one additional resistive element deposited on the substrate, but not on the membrane;

said resistive elements being connected as components of a bridge circuit into the absolute pressure transducer circuit.

16. The improvement of claim 15, including a dielectric film passivation layer deposited on and covering the dielectric film membrane and resistive elements.

17. The improvement of claim 15:

(i) wherein heat conduction away from the resistive element that is positioned on the membrane is a function of absolute pressue and temperature of a gas adjacent the membrane, wherein such heat conduction affects resistivity of said resistive element on the membrane, and wherein such resistivity is measurable by the bridge circuit as an indication of absolute pressure of the gas adjacent the membrane, and (ii) wherein heat conduction away from the resistive element that is positioned on the substrate is lesssubject to absolute pressure of the gas adjacent the membrane than said resistive element that is positioned on the membrane, but is as subject as the resistive element positioned on the substrate to temperature of the gas adjacent the membrane, and wherein such resistivity of said resistive element on the substrate functions in the bridge circuit as an offset to temperature effects of the gas on resistivity of the element on the membrane so that the bridge circuit functions to measure absolute pressure of the gas adjacent the membrane substantially independent of the temperature of said gas.

18. The improvement of claim 17, including a cover, said cover having a cavity positioned over the membrane opposite the cavity in the substrate, said cover having an opening extending from outside of the cover to the cavity in the cover so that the gas is free to flow between the manifold and the cavities.

19. The improvement of claim 18, wherein the cavity in the cover has a volume and the cavity in the substrate has a volume, and wherein the volume of the cavity in the cover is substantially equal to the volume of the cavity in the substrate.

20. The improvement of claim 19, wherein the cavities in the substrate and cover are small enough such that distances from the membrane across the cavities to the substrate and cover, respectively, are less than thermal boundary layers that form around the filaments in order to minimize effects of environment temperature changes on absolute pressure sensor output.

21. The improvement of claim 20, wherein such distances from the membrane across the cavities to the substrate and cover, respectively, are not more than ten times the mean free path of gas molecules in the cavities.

22. The improvement of claim 21, wherein such distances from the membrane across the cavities to the substrate and cover, respectively, are about 20 $\mu$m.

23. The improvement of claim 22, wherein sensitivity of the absolute pressure sensor without undesirable flat zones spans a range $10^{-5}$ to 1,000 torr.

24. The improvement of claim 23, including an auxiliary amplifier in the absolute pressure transducer circuit for additional sensitivity and measurability at pressures below $10^{-4}$ torr.

25. The improvement of claim 10, wherein the differential pressure sensor includes a piezo differential pressure sensor and is mounted by a potting material in a housing in a manner that divides the housing so that a top surface of the piezo differential pressure sensor is exposed only to ambient atmospheric pressure $P_A$ and a bottom surface of the piezo differential pressure senosr is exposed only to load lock pressure $P_L$ with the housing attached to the printed circuit board and the printed circuit board attached to the manifold.

26. A miniaturized combination differential and absoluted pressure transducer for producing control signals based on pressure in a chamber, comprising:
a printed circuit board comprising a differential pressure transducer circuit and an absolute pressure transducer circuit, including a differential pressure sensor connected to the printed circuit board mechanically and electrically as an integral component of the differential pressure transducer circuit, an absolute pressure sensor connected to the printed circuit board mechanically and electrically as an integral component of the absolute pressure transducer circuit; and an electrical connector connected to the printed cirucit board mechanically and electrically as an integral component for output of the control signals from the differential pressure transducer circuit and from the absolute pressure circuit; and
a manifold with a connector fitting adapted for connection of the manifold to the chamber and with ducts extending between the connector fitting and a surface, wherein said printed circuit board is mounted on said manifold with the differential pressure sensor and the absolute pressure sensor sealed against said surfae around respective ones of said ducts such that said differential pressure sensor and said absolute pressure sensor are exposed to the pressure in the chamber via said ducts upon connection of the manifold to the chamber.

27. A combination differential and absolute pressure transducer for producing load lock control signals based on pressure in a load lock chamber, comprising:
a micropirani absolute pressure sensor, which includes: (i) a substrate with a first cavity extending into its midsection and positioned in fluid flow communication with the load lock chamber such that gas pressure in the first cavity is the same as gas pressure in the load lock chamber; (ii) a cover with a second cavity extending into its midsection, said cover being positioned on the substrate with said second cavity juxtaposed to said fist cavity and in fluid flow communication with the load lock chamber so that gas pressure in the second cavity is also the same as the gas pressure in the load lock chamber; (iii) a membrane extending between the first cavity and the second cavity; (iv) a first resistive element positioned in the membrane, said resistive element having a resistivity that changes as a function of temperature; and a second resistive element positioned on the substrate;
a differential pressure sensor, which includes: (i) A substrate supporting a resiliently flexible membrane, said substrate being mounted and sealed in such a mannuer that one side of the membrane is exposed to ambient atmospheric pressure and the opposite side is exposed to a cavity that is in fluid flow communication with the load lock chamber such that gas pressure in said cavity on said opposite side of the membrane is the same as the gas pressure in the load lock chamber; and (ii) a third resistive element that changes resistivity as a function of flexture positioned on the membrane; and
a load lock control circuit comrprising: (i) an absolute pressure transducer circuit including micropirani sensor bridge circuit in which the first and second resistive elements are connected as separate branches, a first bridge voltage controller for maintaining balance in the micropirani sensor brige circuit, a first voltage monitor for measuing voltages needed to keep the micorpirani sensor bridge circuit in balance as an indication of absolute pressure in the load lock chamber, and a first relay control circuit set to activate a first relay switch to produce a first control signal when the pressure of gas in the load lock chamber is pumped down to an absolute pressure set point; and (ii) a differential pressure transducer circuit including a differential pressure sensor bridge circuit in which said third resistive element is connected as a branch, a second bridge voltage controller for maintaining balance in the differential pressure sensor bridge circuit, a second voltage monitor for measuring voltages needed to keep the differential pressure sensor bridge circuit in balance as an indication of differential pressure between ambient atmospheric pressure and the gas pressure in the load lock chamber, and a second relay control circuit set to actuate a second relay switch to produce a second control signal when the differential pressure reaches a differential pressure set point.

28. The combination differential and absolute pressure transducer of claim 27, wherein the first cavity and the second cavity in the micropirani absolute pressure sensor are each smaller than a thermal boundary layer that forms adjacent the resistive elements.

29. The combination differential and absolute pressure transducer of claim 28, wherein the first cavity and the second cavity are each about 20 $\mu$m deep.

* * * * *

UNITED STATES PATENT AND TRADEMARK OFFICE
CERTIFICATE OF CORRECTION

PATENT NO.     : 6,672,171 B2  
DATED          : January 6, 2004  
INVENTOR(S)    : Youfan Gu, Garry Holcomb and Ole Wenzel Page 1 of 1

It is certified that error appears in the above-identified patent and that said Letters Patent is hereby corrected as shown below:

<u>Columns 19, 20, 21, 22 and 23,</u>
Delete claims 1-9

<u>Column 23,</u>
Line 66, delete "opeining" and insert -- opening --

Signed and Sealed this

Twelfth Day of October, 2004

JON W. DUDAS  
*Director of the United States Patent and Trademark Office*